US009390765B2

(12) United States Patent  (10) Patent No.: US 9,390,765 B2
Sato et al.  (45) Date of Patent: Jul. 12, 2016

(54) SRAM WITH VIA DISPLACEMENT

(71) Applicant: Renesas SP Drivers Inc., Kodaira-shi, Tokyo (JP)

(72) Inventors: Kazuhiko Sato, Tokyo (JP); Yasuhiro Fujii, Tokyo (JP)

(73) Assignee: Synaptics Display Devices GK, Tokyo (JP)

( * ) Notice: Subject to any disclaimer, the term of this patent is extended or adjusted under 35 U.S.C. 154(b) by 276 days.

(21) Appl. No.: 13/915,623

(22) Filed: Jun. 11, 2013

(65) Prior Publication Data

US 2013/0329480 A1  Dec. 12, 2013

(30) Foreign Application Priority Data

Jun. 12, 2012  (JP) .................................. 2012-132831

(51) Int. Cl.
*G11C 5/06* (2006.01)
*G11C 11/412* (2006.01)
*H01L 27/11* (2006.01)

(52) U.S. Cl.
CPC ................ *G11C 5/06* (2013.01); *G11C 11/412* (2013.01); *H01L 27/1104* (2013.01); *H01L 2924/0002* (2013.01)

(58) Field of Classification Search
CPC .... G11C 5/06; G11C 11/412; H01L 27/1104; H01L 2924/0002
USPC .............................. 365/63, 181; 257/329, 379
See application file for complete search history.

(56) References Cited

U.S. PATENT DOCUMENTS

| 6,469,400 B2* | 10/2002 | Kumagai | ................ H01L 27/11 257/314 |
| 2002/0195667 A1* | 12/2002 | Maki | ................... H01L 27/1104 257/379 |
| 2004/0043550 A1* | 3/2004 | Chakihara | ....... H01L 21/823885 438/199 |

FOREIGN PATENT DOCUMENTS

| JP | H 09-162281 A | 6/1997 |
| JP | 2001-291783 A | 10/2001 |
| JP | 2003-303881 A | 10/2003 |
| JP | 2010-166102 A | 7/2010 |

OTHER PUBLICATIONS

Office Action for corresponding Japanese Application No. 2012-132831 (issued Jan. 28, 2016).

* cited by examiner

*Primary Examiner* — Tha-O H Bui
(74) *Attorney, Agent, or Firm* — Miles & Stockbridge P.C.

(57) ABSTRACT

The SRAM memory cell includes a metal wiring line having a titanium or tantalum film in a bottom layer, and a via having a tungsten plug. The via is arranged on the metal line following a layout rule which permits the misalignment. In arranging the upper-layer via with a tungsten plug on the metal line, one side of the via is disposed to be adjacent to one end of the metal line with a margin smaller than an alignment accuracy, and the lower-layer via is laid out far away from the end of the metal line as possible. The reduction in the yield, caused by the problem of the contact with the lower-layer via being broken or increased in resistance at occurrence of misalignment, can be suppressed.

14 Claims, 27 Drawing Sheets

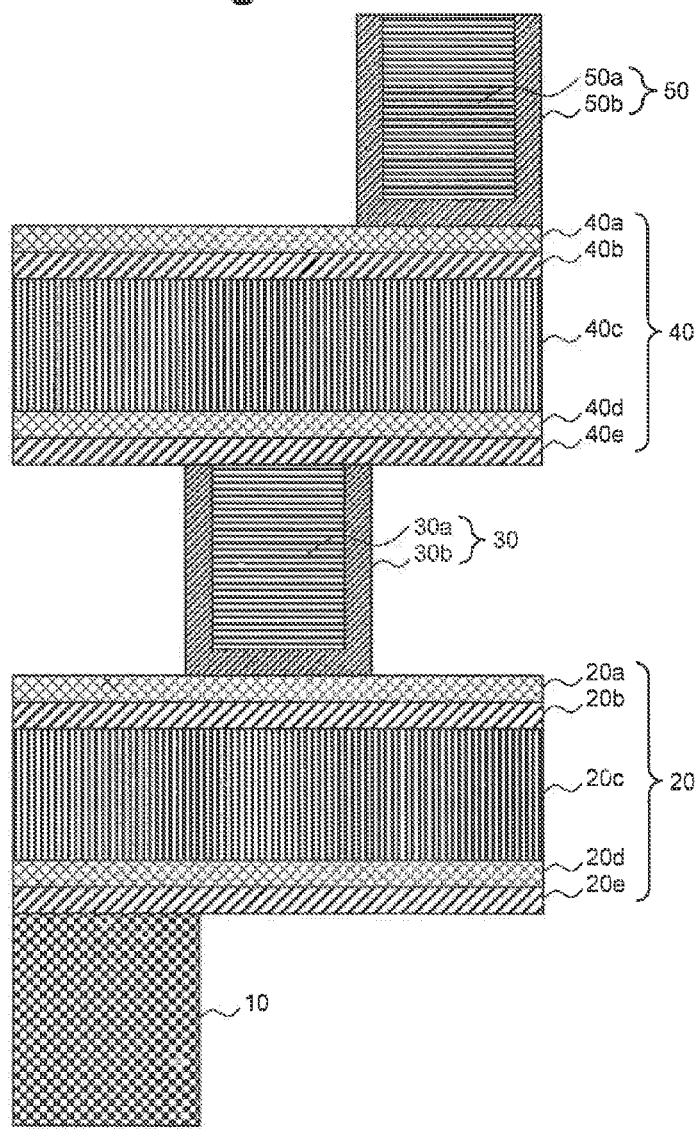
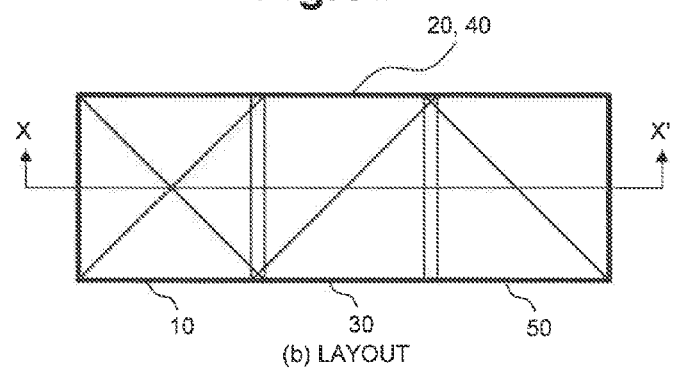

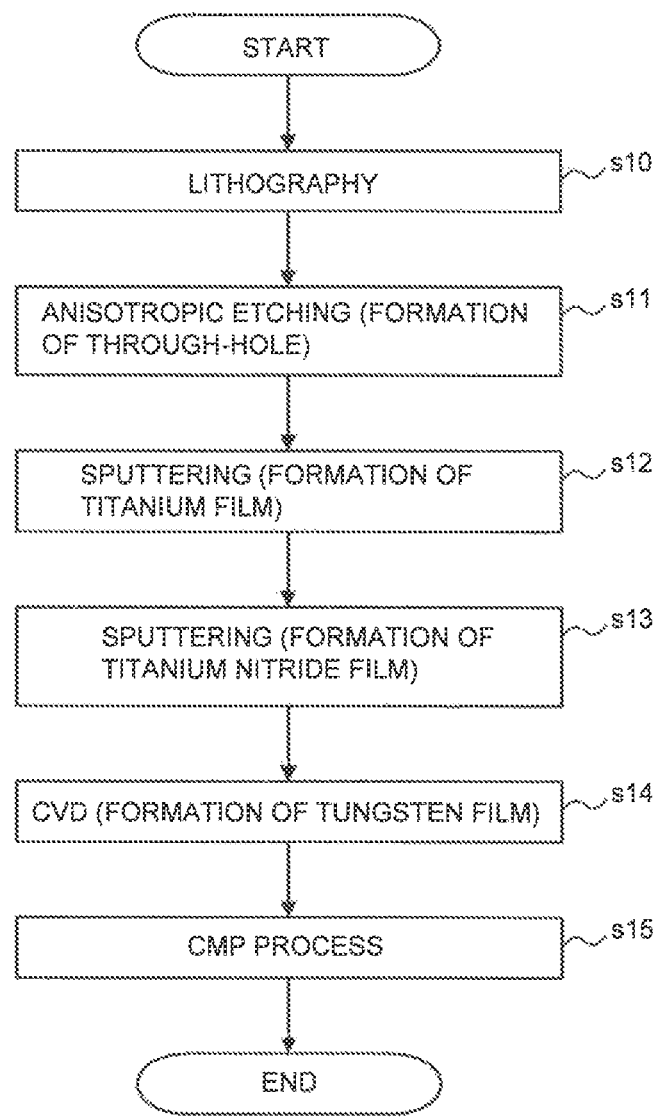

(a) CROSS SECTION TAKEN ALONG THE LINE X-X'

(b) LAYOUT (a) CROSS SECTION TAKEN ALONG THE LINE X-X'

(b) LAYOUT (a) CROSS SECTION TAKEN ALONG THE LINE X-X'

(b) LAYOUT

SRAM WITH VIA DISPLACEMENT

CROSS-REFERENCE TO RELATED APPLICATIONS

The Present application claims priority from Japanese application JP 2012-132831 filed on Jun. 12, 2012, the content of which is hereby incorporated by reference into this application.

BACKGROUND

The present invention relates to the layout of a high-density SRAM which can be suitably used for suppressing the decrease in yield.

There has been a tendency such that even a layout margin must be reduced with the increase in the integration scale of SRAM (Static Random Access Memory). Particularly, a large number of memory cells are arranged in a matrix form, and therefore SRAM is designed so as to scale down individual memory cells in area to the absolute extent possible.

JP-A-2010-166102 discloses a group of SRAM memory cells designed in layout so that a word line and a VSS source line are arranged in different wiring layers and cross each other at right angles. In this case, the word line and VSS source line never extend in parallel over a long distance in a common wiring layer and therefore, the increase in the parasitic capacitance between wiring lines can be suppressed, and the decrease in the yield result from a failure of short circuit caused by a particle extending athwart the two wiring lines can be prevented.

To facilitate further downsizing without increasing the number of wiring layers, the layout margin must be reduced. For instance, with a through-hole via, hereinafter referred to as "via" simply, for connecting between wiring layers, a layout rule of making a wiring layer larger than a via has been adopted conventionally in consideration of the alignment accuracy in a photolithography process. However, a layout rule of permitting the width of a wiring layer as large as the size of a via has been also adopted for high-density SIAM cells. In this case, an end of a wiring line is disposed in line with an end of a via. Therefore, an alignment deviation brings about a condition which is referred as "misalignment" or "gap creation", in which a via is formed where no wiring line is located.

JP-A-2003-303881 points out a problem arises between an aluminum wiring line and a via having a tungsten plug in a case such that the misalignment is allowed, and discloses a semiconductor manufacturing process to solve the problem. In the tungsten plug, a barrier film constituted by a titanium film for covering the bottom of the via, and the side wall thereof, and a titanium nitride film is formed. The reason for making this arrangement is to prevent the occurrence of a void as a result of the production of aluminum fluoride owing to a reaction between tungsten hexafluoride used in CVD (Chemical Vapor Deposition) of tungsten, and aluminum. In the state of the misalignment, the aspect ratio of the via becomes higher, which makes difficult to form a titanium/titanium nitride multilayer film serving as a barrier film of the plug on the side wall of the through-hole, and the aluminum of the wiring layer is left bared. Thus, the aluminum reacts with the tungsten hexafluoride where a sufficient barrier film is not formed, thereby producing a void, which poses problems such as the deterioration in the reliability of electrical connection between the plug and the wiring line, and the rise in connection resistance arise (see Paragraph No. 0006 of JP-A-2003-303881). Further, in case that the barrier film does not have a sufficient titanium nitride film near the bottom of the via, so the barrier film is constituted by only the titanium film, and the titanium film reacts with the tungsten hexafluoride and disappears, resulting in the exfoliation in the titanium nitride film (see Paragraph No. 0007 of JP-A-2003-303881). To solve the problems, JP-A-2003-303881 discloses a step for forming, by e.g. a highly directional sputtering method, a titanium nitride film serving as a barrier film in a through-hole, wherein the bared wiring line side face is nitrified by means of exposure to a nitrogen-containing gas (see Paragraph Nos. 0043 to 0046 of JP-A-2003-303881). Even if aluminum is exposed from the side face of the wiring line, the portion so exposed has been already nitrified with aluminum nitride formed therein, and the aluminum of the wiring line is prevented from reacting with tungsten hexafluoride. Therefore, even the adoption of the layout rule which permits the misalignment never causes the drop of the yield.

SUMMARY

The inventors adopted the layout rule which permits the misalignment as in the above-described cases for SRAM memory cells in a finer semiconductor manufacturing process, and found another failure mode attributed to the misalignment. Then, it was found that the failure mode arose in the condition that a via of an underlying layer and an via of an overlying layer between which a wiring line made of a metal such as aluminum was sandwiched were located in the same place in terms of the layout design, i.e. the via holes were arranged to have a center axis common thereto, and one end of the metal wiring line was disposed so as to be adjacent to one side of the via of the overlying layer with a margin between the one end of the metal wiring line and the one side of the via of the overlying layer; the margin was smaller than the alignment accuracy. The metal wiring line includes e.g. a lower titanium film, a lower titanium nitride film, a copper-added aluminum film, an upper titanium film, and an upper titanium nitride film. In each via hole, tungsten is embedded by means of CVD using tungsten hexafluoride. The inventors analyzed a cross section of a faulty portion, and then found that of the via holes, one via hole formed with the misalignment caused extended to a lower portion of the metal wiring line, and the bottom titanium film which should be present in a range from the end face of the wiring line to the top of the via of the underlying layer was lost. In case that the disappearance of the lower titanium film like this expands over all the upper portion of the via of the underlying layer, the electrical connection between the metal wiring line and the via of the underlying layer is obstructed, and thus broken; even if the disappearance is confined within part of the upper portion, the problem that the contact resistance becomes larger is caused.

Conventionally, even if the misalignment occurs, the via hole etching never reaches a lower portion of a metal wiring line. This is described in e.g. JP-A-2003-303881 with reference to FIG. 7. Therefore, in regard to the influences of the misalignment, attention has been focused on only the influence on the contact between the via involved in the misalignment, and a portion of a wiring layer underlying the via. The relation of the metal wiring line and the via of the overlying layer is restricted by a layout rule. If the layout rule is one which permits the misalignment, countermeasures have been taken to prevent the occurrence of problems by making improvements or modifications of a manufacturing process, and a device structure.

However, the analysis made by the inventors revealed a new problem that in case that a fine-scale semiconductor manufacturing process further increased in the scale of integration is adopted, the misalignment occurring between a via of the overlying layer and a metal wiring line affects the contact between the metal wiring line and the via of the underlying layer as described above. The problem was newly posed by a change or modification in device structure, such as decreasing a wiring layer of a metal wiring line in thickness, which was made in order to increase the scale of integration. According to a conventional layout rule, the relation between adjacent layers is restricted. The new problem arises only in a place where the lower titanium film of a metal wiring line is lost, and the via of the underlying layer is placed instead in a situation that the misalignment is caused between the wiring line and an via of the overlying layer. Therefore, such situation cannot be inhibited or limited. In addition, the inventors performed a further analysis and found that even if the wiring layer is made of material other than aluminum, the same reaction is caused between the titanium or tungsten film and the tungsten hexafluoride forming the tungsten of the via and then the same problem occurs as long as the metal wiring line has a titanium or tungsten film in touch with the via of the underlying layer.

It is an object of the invention to prevent the deterioration in the reliability of connection between the wiring layer and a via of the underlying layer, and the decrease in the yield owing to the increase in electrical contact resistance even in a case where a layout rule which permits so-called the misalignment such that the etching for forming the via of the overlying layer reaches outside the region of the wiring layer is adopted for a wiring layer and a via of the overlying layer.

The means for solving the problem will be described below. The other problems and novel features thereof will become apparent from the description hereof and the accompanying diagrams.

The means according to one embodiment of the invention is as follows.

On condition that the via of the overlying layer having a tungsten plug is disposed on a metal wiring line including a titanium or tantalum film in its bottom layer so that one end of the wiring line is adjacent to one side of the via of the overlying layer with a margin smaller than the alignment accuracy between the one end of the wiring line and the one side of the via of the overlying layer, the via of the underlying layer is arranged apart from the end of the metal wiring line as far as possible.

The effect achieved by the embodiment will be described briefly below.

Even in a case where a layout rule which permits the misalignment is adopted for a metal wiring layer having a bottom layer including a titanium film or a tantalum film, and an via of the overlying layer having a tungsten plug, it is possible to prevent the deterioration in the reliability of connection between the metal wiring layer and a via of the underlying layer, and the decrease in the yield owing to the increase in electrical contact resistance.

BRIEF DESCRIPTION OF THE DRAWINGS

FIGS. 1A and 1B are a sectional view and a layout illustration for explaining the layout of first and second wiring lines, a contact for connecting them, and first and second vias according to the invention;

FIG. 2 is a flow chart showing an example of a semiconductor manufacturing process for forming a via according to an embodiment of the invention;

DETAILED DESCRIPTION

1. Summary of the Embodiments

Figure 3A:
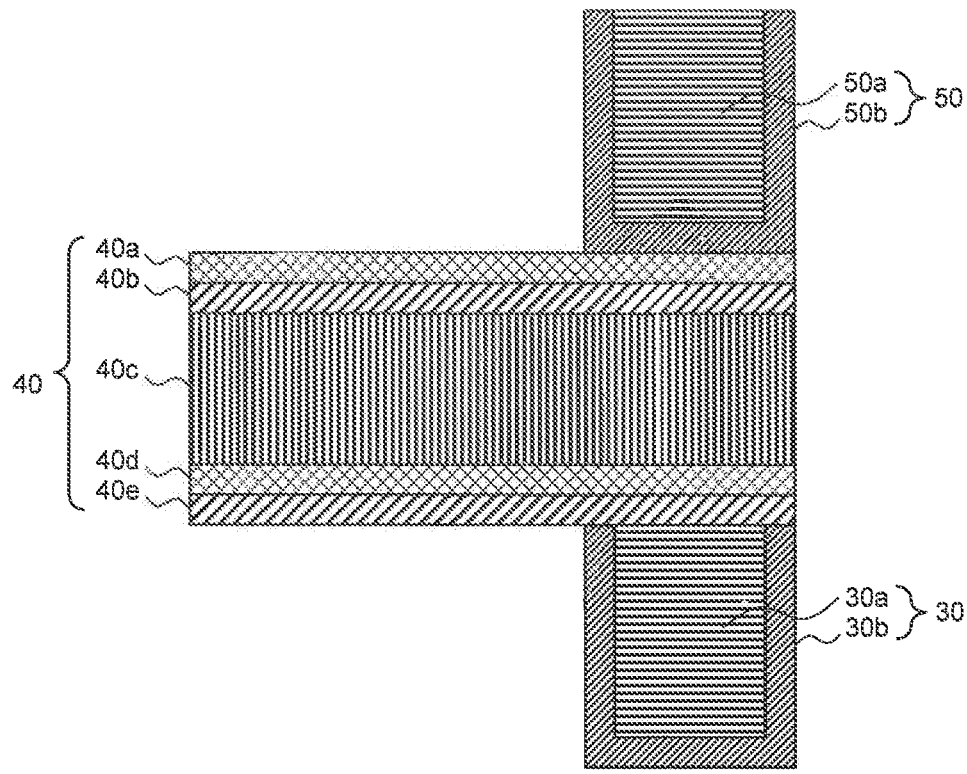
FIGS. 3A and 3B are a sectional view and a layout illustration for explaining the mechanism of failure occurrence, showing parts including the second via, the second wiring line and the first via with no failure caused.

The representative embodiments herein disclosed will be outlined, first. Here, the reference numerals and characters for reference to the drawings, which are accompanied with paired round brackets, only exemplify what the concepts of members or components referred to by the numerals or characters contain.

[1] <CONT-M1-V1-M2-V2>

The SRAM has a plurality of memory cells arranged in a matrix form. Each memory cell has:

(a) a substrate with MOSFETs formed thereon;

(b) a contact (10, 10_5, 10_8, 10_9, 10_12) for forming an electrical connection with the MOSFETs;

(c) a first wiring line (20, 20_3, 20_4, 20_7, 20_10) which is electrically connected with the contact, and formed by a first wiring layer having a metal layer (20e) of titanium or tantalum in a plane in touch with the contact, and which has a width as large as a minimum line width in the first wiring layer;

(d) a first via (30, 30_3, 30_4, 30_6, 30_8) which has a tungsten plug (30a) and is electrically connected with the first wiring line;

(e) a second wiring line (40, 4_2, 40_3, 40_5, 40_7) which is electrically connected with the first via, and formed by a second wiring layer having a metal layer (40e) of titanium or tantalum in a plane in touch with the first via, and which has a width as large as a minimum line width in the second wiring layer; and (f) a second via (50, 50_1, 50_2, 50_5, 50_6) which is electrically connected with the second wiring line, and which has a tungsten plug (50a) and has one side as large as the minimum line width in the second wiring layer, wherein the second wiring line extends in the same direction as that of the first wiring line extending in a row or column direction, and has a length of two to three times the minimum line width in the second wiring layer, and in a plane in parallel with the substrate, the first via is disposed in a position between the contact and the second via so that a distance between the first via and the contact is shorter than a distance between the contact and the second via, and a distance between the first and second vias is shorter than the distance between the contact and the second via.

According to the embodiment like this, even in the case of using the first and second wiring lines 20 and 40 each composed of an island-like wiring line which is restricted, in length, to less than triple the minimum line width to form electrical connection from each contact to the third wiring line, the reduction in the yield attributed to a connection failure resulting from the disappearance of a titanium or tantalum layer located in a bottom portion of the wiring layer can be suppressed.

[2] <Best Mode of CONT-M1-V1-M2-V2>

In the SRAM as described in [1], the first via is disposed, in a plane in parallel with the substrate, in a position where the distance between the first and second vias is equal to the distance between the first via and the contact.

According to the embodiment like this, the reduction in the yield attributed to the connection failure can be suppressed the most effectively.

[3] <Single Piling of V1>

In the SRAM as described in [1] or [2], a direction in which the first wiring line extends is defined as a row direction, and each memory cell further includes:

(g) a third wiring line (60_1, 60_2) which is electrically connected with the second via, and formed by a third wiring layer, and which extends in a column direction orthogonal to the row direction at a cell boundary (903, 904) of the memory cell, wherein the third wiring line is a ground line in the memory cell, one memory cell which is mirror-inverted about the cell boundary in the row direction in a plane in parallel with the substrate coincides in layout with another memory cell adjacent to the one memory cell, the second via which is mirror-inverted about the cell boundary in the row direction coincides with the second via of the adjacent memory cell, and in one of the memory cells adjacent to each other, the layout of the first via (30_3', 30_4') is left out.

According to the embodiment like this, even in a case such that the first via of a shape other than a pattern, such as a circle or a square, having an aspect ratio of 1:1 in plan view is not allowed, and when two first vias are disposed, it becomes impossible to abide by a design rule which prescribes the spacing between first vias because of the narrowness of an island-like wiring line, these restrictions can be avoided.

[4] <Rectangular V1 at Cell Boundary>

In the SRAM as described in [1] or [2], a direction in which the first wiring line extends is defined as a row direction, and each memory cell further includes:

(g) a third wiring line (60_1, 60_2) which is electrically connected with the second via, and formed by a third wiring layer, and which extends in a column direction orthogonal to the row direction at a cell boundary (903, 904) of the memory cell, wherein the third wiring line is a ground line in the memory cell, one memory cell which is mirror-inverted about the cell boundary in the row direction coincides in layout with another memory cell adjacent to the one memory cell, the second via which is mirror-inverted about the cell boundary in the row direction coincides with the second via of the adjacent memory cell, and the first vias (30_3', 30_4') of the memory cells adjacent to each other are joined to each other.

According to the embodiment like this, the resistance produced by the first via can be held down.

[5] <Bit Line in Transverse Type Memory Cell>

In the SRAM as described in [1] or [2], a direction in which the first wiring line extends is defined as a row direction, and each memory cell further includes: (g) a third wiring line (60_3, 60_4) which is electrically connected with the second via, and formed by a third wiring layer, and which extends in a column direction orthogonal to the row direction, wherein the third wiring line is a bit line in the memory cell.

The embodiment like this allows the suppression of the reduction in the yield when applied to a bit line in a transverse type memory cell.

[6] <CONT-M1-V1>

The SRAM has a plurality of memory cells arranged in a matrix form. Each memory cell has:

(a) a substrate with MOSFETs formed thereon;

(b) a contact (10, 10_13, 10_17, etc.) for forming an electrical connection with the MOSFETs;

(c) a first wiring line (20, 20_11, 20_13, etc.) which is electrically connected with the contact, and formed by a first wiring layer having a metal layer of titanium or tantalum in a plane in touch with the contact, and which has a width as large as a minimum line width in the first wiring layer and a length of up to double the minimum line width; and (d) first vias (30, 30_9, 30_11) which each have a tungsten plug and are electrically connected with the first wiring lines, wherein in a plane in parallel with the substrate, the first via is disposed to be adjacent to one end of the first wiring line with a margin smaller than an alignment accuracy between the first via and the first wiring line, and the contact is disposed on the other end of the first wiring line.

According to the embodiment like this, it is possible to suppress the reduction in the yield caused by the connection failure of the first wiring line and the contact, which results from the disappearance of the titanium or tantalum layer located in a bottom portion of the wiring line as a result of the misalignment of the first via on the first wiring line.

[7] <Bit Line of Vertical Type Memory Cell>

In the SRAM as described in [6], each memory cell further includes: (e) a second wiring line (40, 40_8, 40_10, etc.) which is electrically connected with the first via, and formed by a second wiring layer, and which extends in a column direction orthogonal to a row direction, wherein the second wiring line is a bit line in the memory cell.

Applying the embodiment like this to a bit line in a vertical type memory cell, the reduction in the yield can be suppressed.

[8] <V1-M1-V2>

The SRAM has a plurality of memory cells arranged in a matrix form. Each memory cell has:

(a) a substrate with MOSFETs formed thereon;

(d) a first via (30, 30_18, 30_19, etc.) having a tungsten plug;

(e) a second wiring line (40, 40_17, 40_18, etc.) which is electrically connected with the first via, and formed by a second wiring layer having a metal layer (40e) of titanium or tantalum in a plane in touch with the first via, and which has a width as large as a minimum line width in the second wiring layer;

(f) a second via (50, 50_8, 50_9) which is electrically connected with the second wiring line, and which has a tungsten plug and has one side as large as the minimum line width in the second wiring layer, wherein in a plane in parallel with the substrate, the second via is disposed to be adjacent to one end of the second wiring line with a margin smaller than an alignment accuracy between the second via and the second wiring line, and the first via is disposed on the other end of the second wiring line.

According to the embodiment like this, even in the case of using the first and second wiring lines 20 and 40 each composed of an island-like wiring line which is restricted, in length, to less than triple the minimum line width to form electrical connection from each contact to the third wiring line, the reduction in the yield attributed to a connection failure resulting from the disappearance of a titanium or tantalum layer located in a bottom portion of the wiring layer can be suppressed. In addition, the resistance produced by the second via can be held down.

[9] <Bit Line of M3 Vertical Type Memory Cell>

In the SRAM as described in [8], each memory cell further includes: (g) a third wiring line which is electrically connected with the second via, and formed by a third wiring layer.

In the SRAM, the third wiring line is a bit line in the memory cell.

Applying the embodiment like this to a bit line in a vertical type memory cell, the reduction in the yield can be suppressed.

[10] <CONT-M1-V1-M2-V2 Between Adjacent Memory Cells of M3 Vertical Type Memory Cell>

The SRAM has a plurality of memory cells arranged in a matrix form. Each memory cell has:

(a) a substrate with MOSFETs formed thereon;

(b) a contact (10, 10_33, 10_41) for forming an electrical connection with the MOSFETs;

(c) a first wiring line (20, 20_24, 20_30, etc.) which is electrically connected with the contact, and formed by a first wiring layer having a metal layer (20e) of titanium or tantalum in a plane in touch with the contact, and which has a width as large as a minimum line width in the first wiring layer;

(d) a first via (30, 30_16, 30_20, etc.) which, has a tungsten plug (30a), and is electrically connected with the first wiring line;

(e) a second wiring line (40, 40_15, 40_19, etc.) which is electrically connected with the first via, and formed by a second wiring layer having a metal layer (40e) of titanium or tantalum in a plane in touch with the first via, and which has a width as large as a minimum line width in the second wiring layer;

(f) a second via (50, 50_7, 50_10, etc.) which is electrically connected with the second wiring line, and which has a tungsten plug (50a) and has one side as large as the minimum line width in the second wiring layer, wherein the second wiring line extends in the same direction as that of the first wiring line extending in a row or column direction, is connected with a corresponding second wiring line in an adjacent memory cell, has a length of 4 to 8 times the minimum line width in the second wiring layer, and in a plane in parallel with the substrate, the first via is disposed in a position between the contact and an adjacent second via in the adjacent memory cell, which corresponds to the second via so that the distance between the first via and the contact is shorter than the distance between the contact and the adjacent second via, and the distance between the first via and the adjacent second via is shorter than the distance between the contact and the adjacent second via.

[11] <Best Mode of SRAM in [10]>

In the SRAM as described in [10], the first via is disposed, in a plane in parallel with the substrate, in a position where the distance between the adjacent second via and the first via is equal to the distance between the first via and the contact.

According to the embodiment like this, the reduction in the yield resulting from the connection failure can be suppressed the most effectively.

2. Further Detailed Description of the Embodiments

The embodiments will be described further in detail.

[First Embodiment]

FIGS. 1A and 1B are a sectional view and a layout illustration for explaining the layout of first and second wiring lines, a contact for connecting them, and first and second vias according to the invention. In the sectional view of FIG. 1A, only the layers to pay attention to (in FIG. 1, the first via 30, the second wiring layer 40 and the second via 50) are drawn for the sake of easy understanding, and the graphical representations of other layers including a substrate and an interlayer dielectric film are omitted from the diagram. The same holds true for the subsequent sectional views which accompany the present specification, and to which reference is made below. The first and second wiring lines 20 and 40 are as large as a minimum line width in width, and about triple the width in length, and they are disposed to be superposed on each other in the same position in the layout design. The contact 10 and the first and second vias are disposed on the portion of a length of about triple the minimum line width. The contact 10 is arranged so that at one end of the first wiring line 20 in a longitudinal direction, one side of the contact is superposed on the one end of the first wiring line 20 on the same straight line. The second via 50 is arranged so that at an end of the second wiring line 40 opposite to the one end of the first wiring line 20 in the longitudinal direction, one side of the second via 50 is superposed on the end of the second wiring line 40 on the same straight line.

The first via 30 is arranged so as to be located apart from the end of the second wiring line 40, on which the one side of the second via 50 is superposed on the same straight line, in the longitudinal direction to the extent possible so long as its electrical connection can be ensured, and apart from the end of the first wiring line 20, on which the one side of the contact 10 is superposed on the same straight line, in the longitudinal direction by a distance equal to or larger than the margin of the alignment accuracy. It is the most preferable to arrange the first via 30 in a position equally apart from the second via 50 and the contact 10. The reason for this will be described later.

Now, it is noted that the "minimum line width" herein described is originally a numerical value which should be strictly defined for each layer, e.g. each of wiring layers, via layers, and contact layers according to the structure, material, working accuracy, etc. With regard to the memory cell layout, a half of a wiring line pitch, which depends on lines of a top wiring layer having a larger minimum processing size and a spacing thereof, is generally used as the minimum line width for the sake of simplicity. This is because the area of each memory cell is usually restricted by the wiring line pitch of a top wiring layer larger in minimum processing size. In case that the minimum line width is restricted by the minimum processing size of the second via as in FIGS. 1A and 1B, the second via is arranged so that three sides are in touch with the second wiring layer. On the other hand, the minimum processing size of the contact 10 is smaller than the minimum line width. This is because the finer microfabrication is often applicable to the contact 10 in comparison to that applied to the second via layer in reality. The description "the contact 10 is arranged so that at one end of the first wiring line 20 in a longitudinal direction, one side of the contact is superposed on the one end of the first wiring line 20 on the same straight line" is not presented to restrict "on the same straight line" in close consideration of the difference in the minimum processing size like this. Even if there is a deviation as large as the total of a difference in the minimum processing size and a margin depending on the mask alignment accuracy and the like, the deviation shall be involved in the scope of "the same straight line". Deviations like this can be produced along the same straight line or scattered from the line toward a direction which makes a failure easier to further induce according to the actual variation in manufacturing, which leads to the drop in the yield. The problem to be solved by the invention is to prevent the drop in the yield. Therefore, deviations which can be produced on the same straight line according to variations in manufacturing need to be involved in the scope of "the same straight line". The concept like this shall generally apply to the definitions of lengths, widths, positions and others as well as "minimum line width" herein described in common.

Next, the effect brought about by arranging the first and second wiring lines 20 and 40, the contact 10 for connecting them, and the first and second vias 30 and 50 as shown in FIGS. 1 and 1B will be described.

First, the description of the structure of each layer will be presented. The first wiring layer 20 includes a lower titanium film 20e, a lower titanium nitride film 20d, a metal wiring layer 20c, an upper titanium film 20b and an upper titanium nitride film 20a in order from a substrate. Likewise, the second wiring layer 40 includes a lower titanium film 40e, a lower titanium nitride film 40d, a metal wiring layer 40c, an upper titanium film 40b and an upper titanium nitride film 40a in order from a substrate. The first via 30 includes a barrier film 30b which covers the side wall and bottom thereof, and a tungsten plug 30a. Likewise, the second via 50 includes a barrier film 50b which covers the side wall and bottom thereof, and a tungsten plug 50a. The barrier films 30b and 50b are formed by e.g. stacking a titanium film and a titanium nitride film.

The contact 10 is not particular limited. For instance, it may be formed by e.g. a tungsten plug, and a barrier film which is formed by stacking a titanium film and a titanium nitride film, and covers the side wall and bottom thereof.

The first and second wiring layers 20 and 40 are formed according to a known semiconductor manufacturing process. First, the titanium films 20e and 40e, and the titanium nitride films 20d and 40d are deposited by e.g. sputtering. After that, the metal wiring layers 20c and 40c are each formed by a metal wiring line including e.g. aluminum as a primary component. The metal wiring layers may be made of any wiring material, e.g. Al—Cu with copper added thereto, or Al—Cu—Si with silicon added thereto. The first and second wiring layers 20 and 40 may be a damascene structure of tungsten, copper or the like. Further, the titanium films 20b and 40b, and the titanium nitride films 20a and 40a are formed on the surface of the metal wiring layers 20c and 40c in the same way as on their lower portions.

FIG. 2 shows an example of the semiconductor manufacturing process for forming the via according to this embodiment. The first and second vias 30 and 50 can formed by the semiconductor manufacturing process as shown in FIG. 2 respectively. Specifically, a through-hole extending to each of the first and second wiring layers is formed by a combination of the lithography (s10) and the anisotropic etching (s11). Thereafter the titanium film and the titanium nitride film are deposited by sputtering (s12, s13), whereby each of the barrier films 30b and 50b are formed. The plasma-nitriding treatment may be performed on the surface of a titanium film deposited by CVD to form a titanium nitride film. After that, tungsten is deposited by CVD (s14). The unwanted tungsten film on the interlayer dielectric film is removed by CMP (Chemical Mechanical Polish) (s15), whereby the tungsten is left only in the through-hole. In this way, the tungsten plugs 30a and 50a are formed in the first via 30 and the second via 50 respectively.

Figure 3B:
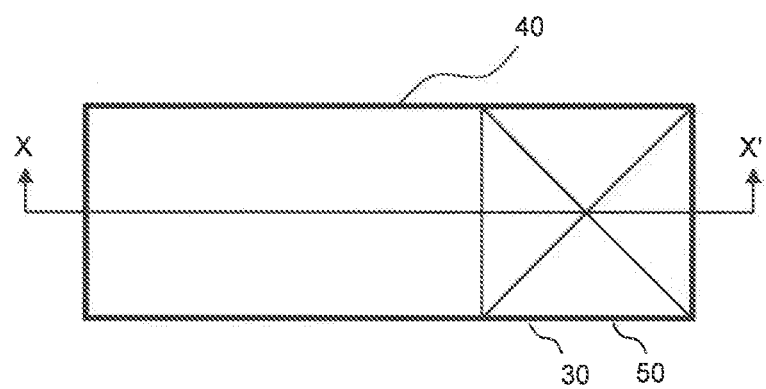

FIGS. 3A and 3B, FIGS. 4 to 7, and FIGS. 8A and 8B are diagrams for explaining the mechanism of failure occurrence. FIGS. 3A and 3B are a sectional view and a layout illustration, which show parts including the second via, the second wiring and the first via with no failure caused. The second wiring line 40 has a width as large as the minimum line width, and a length about triple the width. The first and second vias 30 and 50 are arranged on one end of the wiring line 40 in a longitudinal direction. The first and second vias 30 and 50 each have a square form having four sides as large as the minimum line width, and the three sides thereof are in touch with an end of the second wiring line 40.

Figure 8A:
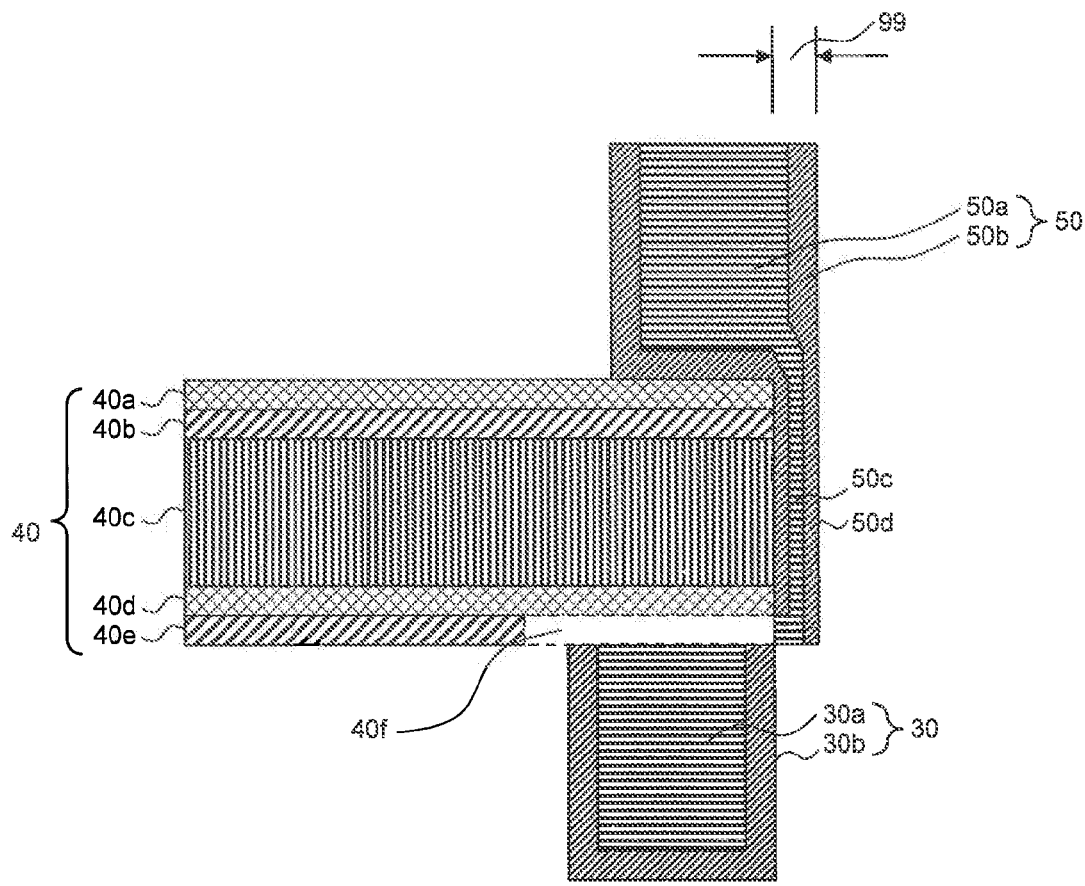
FIGS. 8A and 8B are a sectional view and a layout illustration for explaining the mechanism of failure occurrence, showing a condition with a failure caused.
Figure 8B:
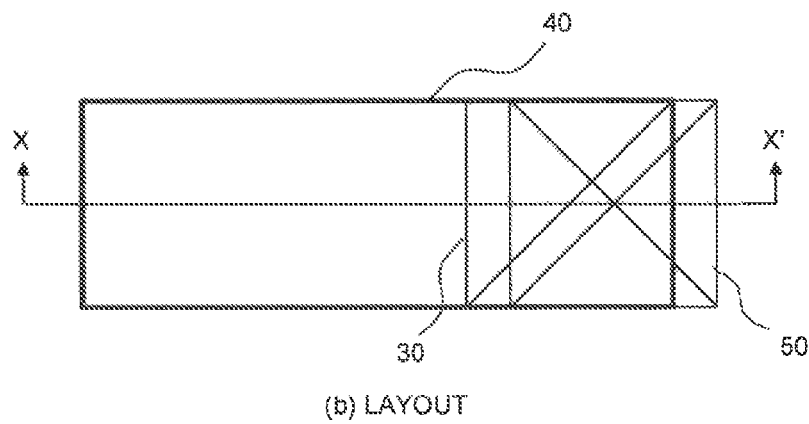

A failure as described concerning the problem to be solved by the invention hereof can be caused in case that the second via 50 is deviated from a proper position for the second wiring line 40 owing to the alignment deviation or the like. The description here is presented on the assumption that the position of the second via 50 is deviated from a proper position for the second wiring line 40 in the longitudinal direction as shown in FIGS. 8A and 8B.

Figure 4:
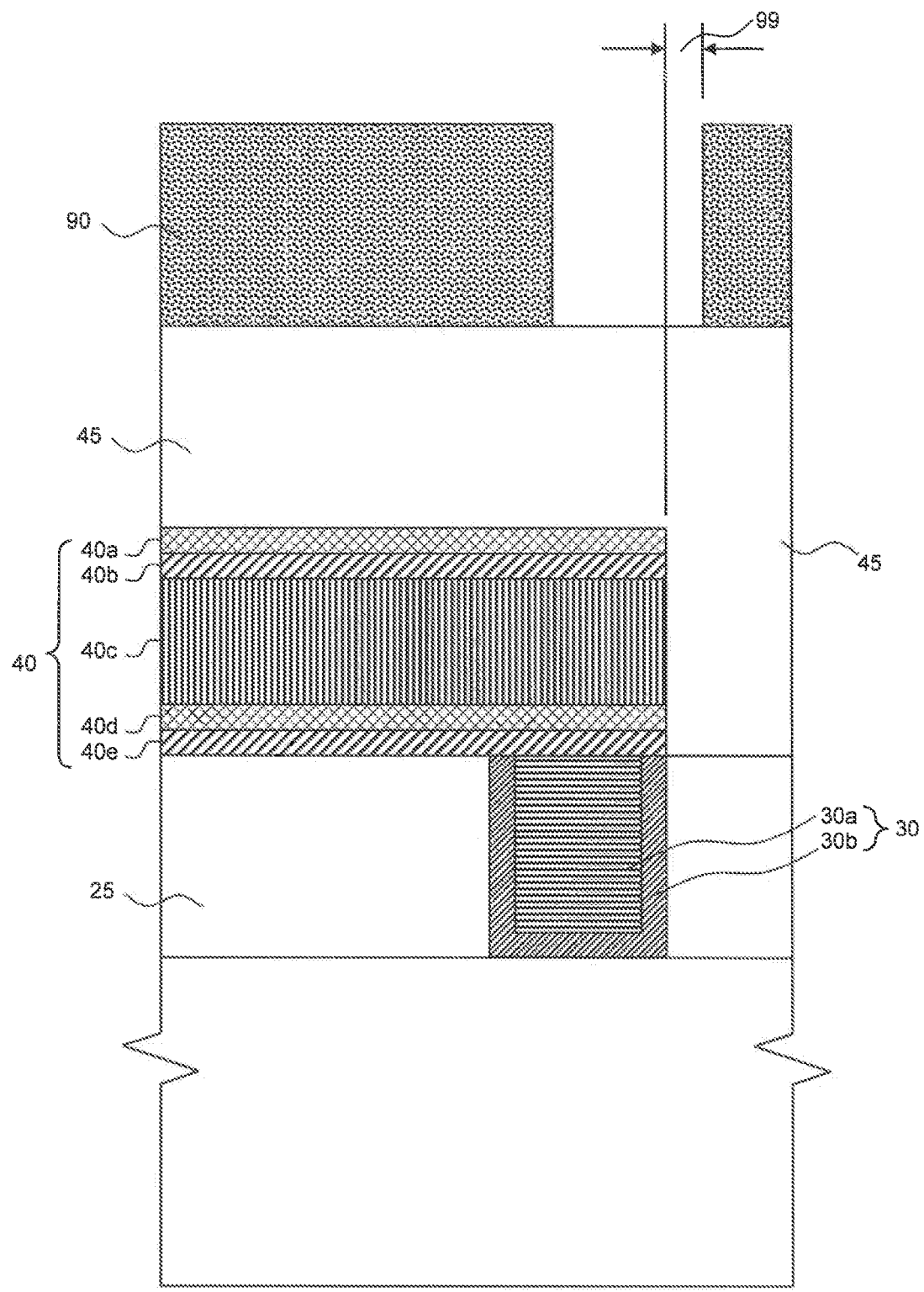
FIG. 4 is a diagram for explaining the mechanism of failure occurrence (the lithography process)

FIG. 4 is a sectional view in lithography, which follows the steps of: forming an interlayer dielectric film 45 on the second wiring; applying a resist 90 thereto; and then removing part of the resist 90 in a position to form a through-hole for the second via by lithography (s10). In this step, it is assumed that the alignment deviation 99 occurs.

Figure 5:
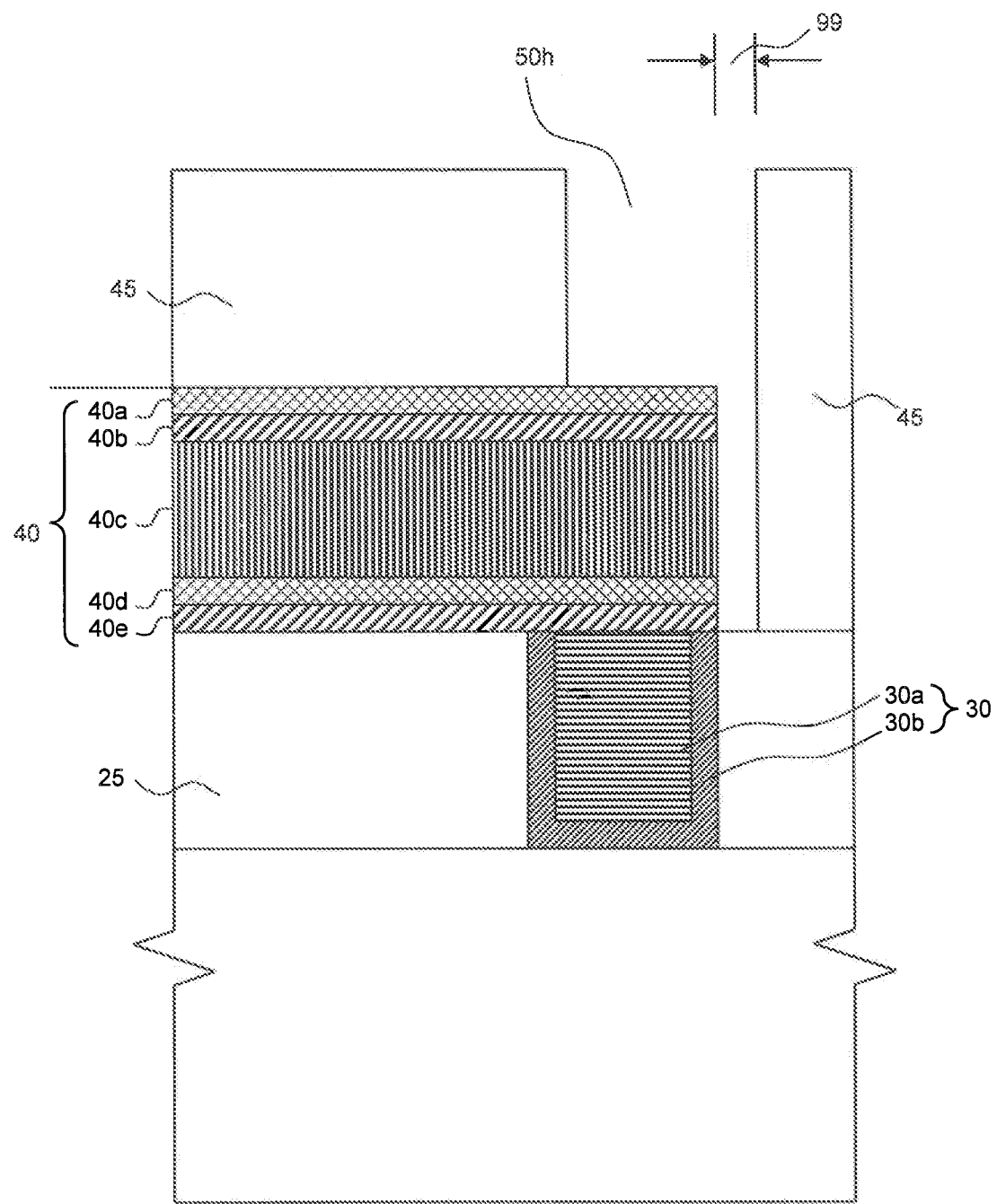
FIG. 5 is a diagram for explaining the mechanism of failure occurrence (the etching process)

FIG. 5 is a sectional view in etching. The resist 90 is used as a mask to perform an anisotropic etching on the interlayer dielectric film 45(s11). The interlayer dielectric film 45, and the second wiring line 40 are made of different materials. Therefore, also after the etching of the interlayer dielectric film directly above the second wiring line 40 has stopped at the surface of the second wiring line 40, the etching of a portion of the interlayer dielectric film 45 which is not masked owing to the alignment deviation, but in touch with the second wiring line 40 goes ahead by the over etching, which is usually performed taking advantage of the selectivity. The etching of the interlayer dielectric film 45 in touch with the second wiring line 40 reaches the bottom of the second wiring line, i.e. the depth of the contact plane forming the boundary between the second wiring line and the first via. In a conventional semiconductor manufacturing process, the etching never proceeds until reaching such deep place. However, there is a tendency to reduce the thicknesses of wiring layers as the microfabrication of semiconductors progresses. Reflecting such circumstance, the etching of the portion of the interlayer dielectric film 45 in touch with the second wiring line 40 reaches the depth of the bottom of the second wiring line. However, this portion of the interlayer dielectric film has only a size as small as the width of the alignment deviation 99 and as such, it has a very large aspect ratio.

Figure 6:
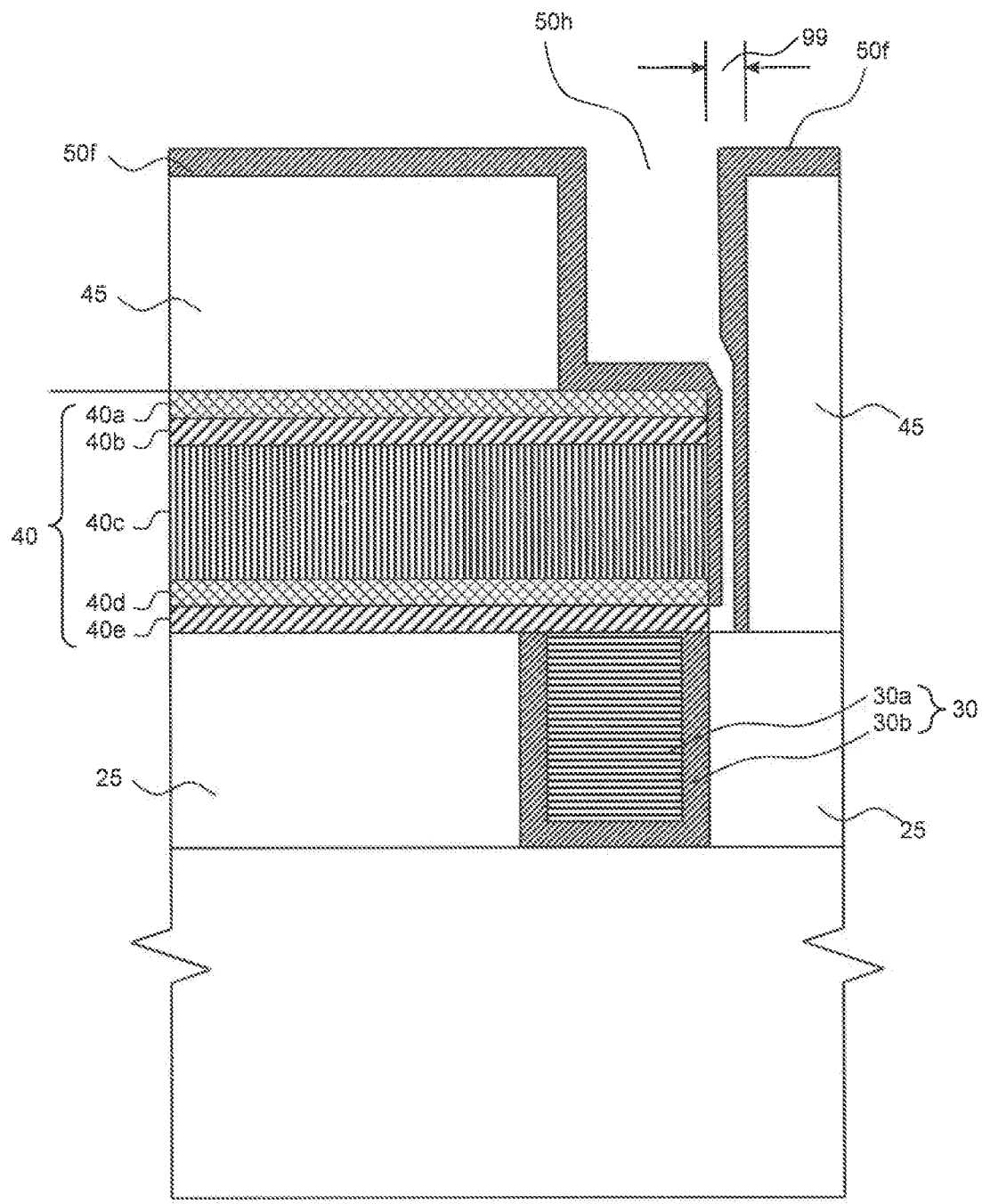
FIG. 6 is a diagram for explaining the mechanism of failure occurrence (the barrier film formation process)

Next, the barrier layer 50f is formed as shown in FIG. 6 (s12, s13). The portion where the etching proceeded to the deeper depth owing to the alignment deviation has an extremely large aspect ratio as described above and therefore, the titanium/titanium nitride multilayer film is sometimes not sufficiently deposited on the side wall in sputtering titanium for the barrier layer 50f (s12, s13). FIG. 6 shows an example such that the barrier layer 50f is not formed only on a side wall of the lower titanium film of the second wiring line 40, which is an extreme case. In reality, the barrier layer 50f is formed unevenly, and an area with no barrier layer is partially formed in the side walls of the wiring layer or the interlayer dielectric film.

Figure 7:
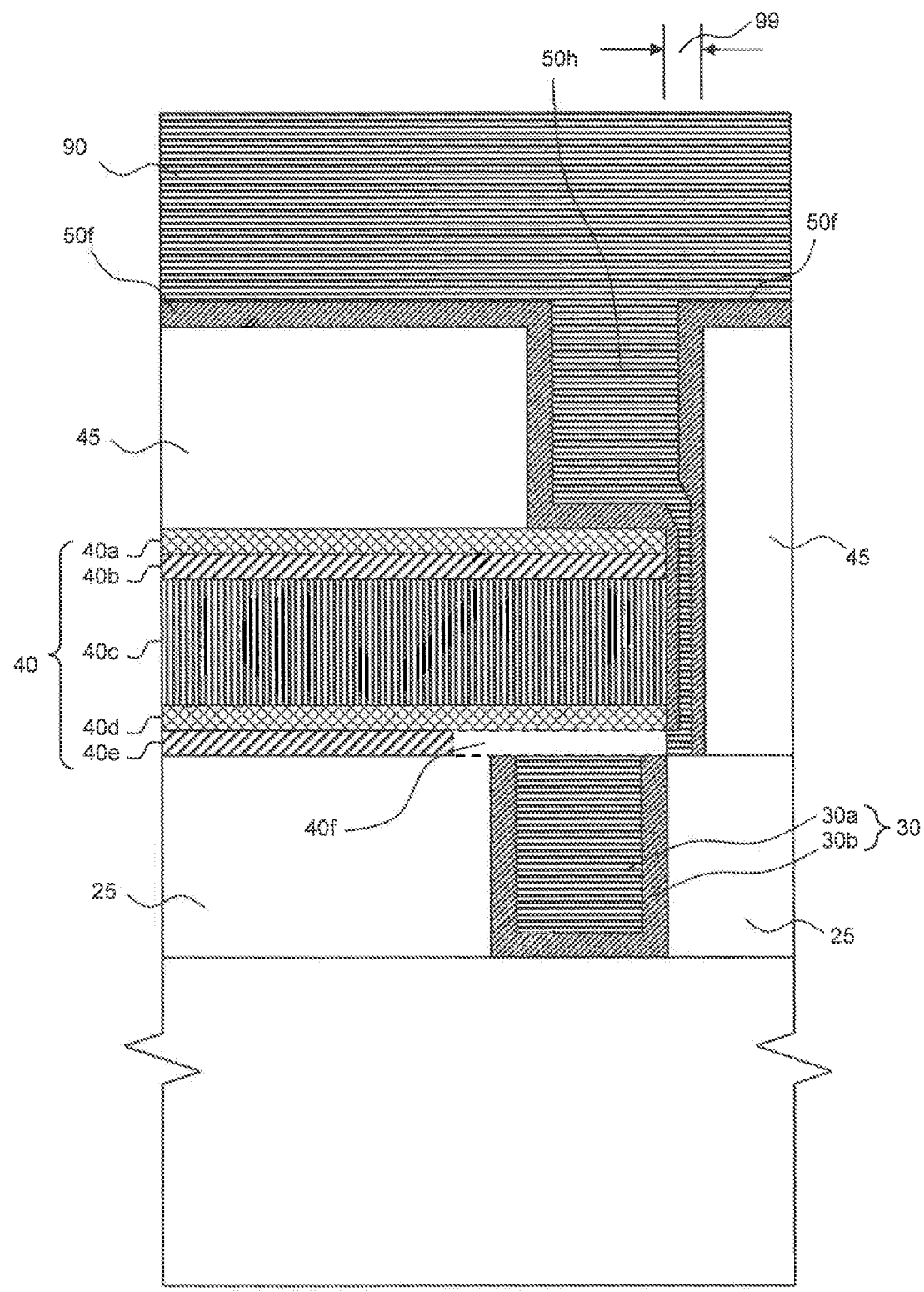
FIG. 7 is a diagram for explaining the mechanism of failure occurrence (the tungsten CVD process)

Next, a tungsten film 90 to be embedded as a plug is formed by CVD as shown in FIG. 7 (s14). After that, the portion of the tungsten film 90 above the interlayer dielectric film 45 is removed by means of CMP or the like to obtain a structure as shown in FIGS. 8A and 8B.

Now, the mechanism of failure occurrence will be described with reference to FIG. 7. In CVD of tungsten, metal tungsten is produced by reducing a tungsten hexafluoride gas by hydrogen, and then deposited. According to the diagram, the through-hole 50h has reached the depth of the lower titanium film 40e of the second wiring line 40 at the bottom, and the barrier layer 50f of the second via 50 is not sufficiently formed on the side wall from which the lower titanium film 40e is bared. In this condition, the lower titanium film 40e is exposed to the tungsten hexafluoride gas. Titanium reacts with tungsten hexafluoride to produce titanium fluoride, and then disappears. Therefore, the lower titanium film 40e exposed to the tungsten hexafluoride gas gradually disappears from the side closer to the through-hole with which the reaction starts. When a quantity of tungsten enough to stop the tungsten hexafluoride gas flowing into the through-hole is deposited inside the through-hole, the disappearance stops. As a result, a region 40f where the lower titanium film is lost arises inside the second wiring line from a side involved with the misalignment. In case that the region ranges all over the top of the first via 30, the electrical connection between the second wiring line and the first via is broken, resulting in a failure. Even if the region not ranges all over the top of the first via 30, but is confined within a part thereof, the region results in a failure attributed to the rise in resistance, or a latent failure of the disconnection which is caused later as long as a sufficient electrical conductivity cannot be obtained. The portion where the lower titanium film is lost makes a cavity. Therefore, in this portion, a detachment can be caused easily, which results in the deterioration in the reliability.

In the first embodiment, the first via is laid out at a distance from the second via as shown in FIGS. 1A and 1B, thereby avoiding that the first via is disposed on the region 40f where the lower titanium film 40e of the second wiring line 40 disappears owing to the misalignment. Thus, the occurrence of the failures as described above can be suppressed. Actually, the quantity of the misalignment, and the size of the region 40f where the lower titanium film is lost are each a statistically fluctuating numerical value. Therefore, the effect of suppressing the reduction in the yield owing to the failures as described above is brought about.

Figure 9A:
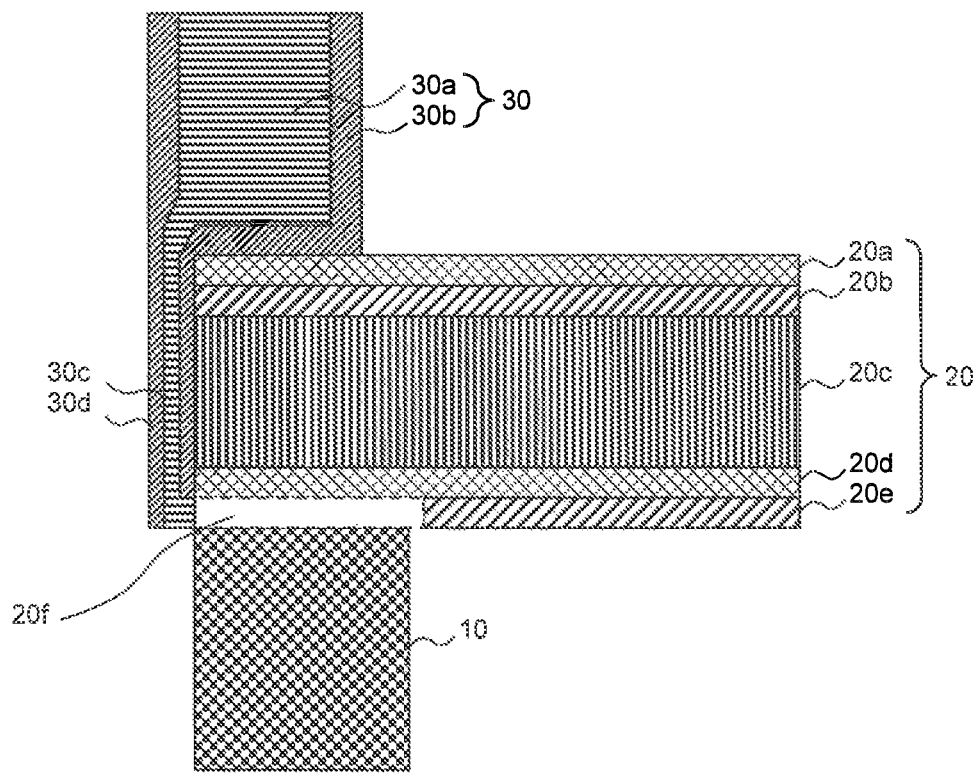
FIGS. 9A and 9B are a sectional view and a layout illustration for explaining the mechanism of failure occurrence, which show parts including the first via, the first wiring and the contact with a failure caused.
Figure 9B:
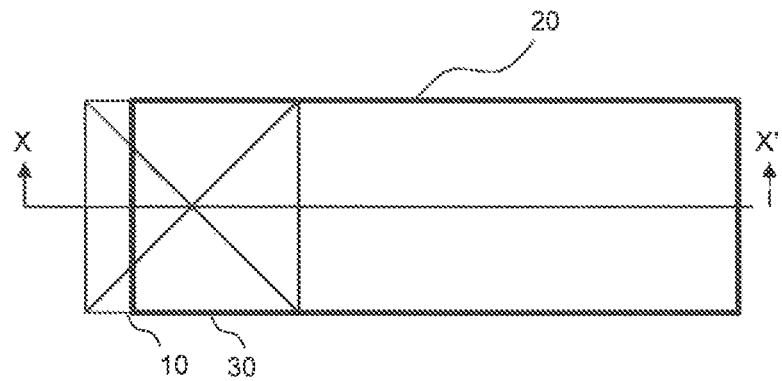

If the first via 30 is displaced to a position right above the other end of the first wiring line 20, the misalignment of the first via 30 can occur on the other end of the first wiring line 20. If the contact 10 is arranged on the same end, the lower titanium film 20e of the first wiring line 20 is partially lost as already described, which can cause the deterioration in the reliability of connection between the first wiring line 20 and the contact 10, and the decrease in the yield owing to the rise in electrical contact resistance. FIGS. 9A and 9B are a sectional view and a layout illustration, which show parts including the first via 30, the first wiring line 20 and the contact 10 with a failure caused. In this case, the misalignment of the first via 30 is caused in the longitudinal direction of the first wiring line 20, and thus a through-hole of the first via is formed to pierce the first wiring line 20 along the end face thereof, and the first wiring line is exposed from the end face of the first wiring line 20. The exposed lower titanium film 20e reacts with tungsten hexafluoride used at the time of forming the tungsten plug of the first via 30 and disappears, and thus a cavity 20f is produced. The cavity 20f which ranges all or partially over the top of the contact 10 results in the deterioration in the reliability of connection between the first wiring line 20 and the contact 10, the disconnection of electrical contact, or the rise in the resistance thereof. The misalignment of the second via to the second wiring can cause a failure comparable to a failure which occurs between the second wiring line and the first via.

In the embodiment described above, a via having a tungsten plug is arranged on a metal wiring line having a combination of a titanium film and a titanium nitride film in its upper and lower portions according to a layout rule which permits the misalignment. After the study, the inventors found that in addition to titanium, tantalum is in danger of being lost by reaction with tungsten fluoride. As to the metal wiring line, in addition to a line including aluminum as a primary component, even a line formed from another kind of metal, such as copper or tungsten, by the damascene method is in danger of suffering the occurrence of a like failure as long as it has a titanium or tantalum film in its bottom. Examples of the structure of such bottom include: Ti/TiN/W tungsten damascene structure; Ti/W tungsten damascene structure; Ta/TaN/Cu copper damascene structure; Ta/Cu copper damascene structure; Ti/TiN/Cu copper damascene structure; and Ti/Cu copper damascene structure. Hence, it is found that a semiconductor manufactured according to a rule which permits the way of arranging a via having a tungsten plug on a wiring line like this with a margin smaller than an alignment accuracy is in danger of suffering the drop in the yield owing to the occurrence of a like failure.

This problem can be solved by arranging the via of the underlying layer apart from the end of the metal wiring line as far as possible on condition that the via of the overlying layer having a tungsten plug is arranged on a metal wiring line including a titanium or tantalum film in its bottom layer so that one side of the via is adjacent to the end of the wiring line with a margin smaller than the alignment accuracy between the one side of the via and the end of the wiring line.

In the case of connecting the contact 10, the first and second vias 30 and 50 to the first and second wiring lines 20 and 40 which have a width as large as the minimum line width and a length triple the width, and which are superposed on each other in the same position in the layout as shown in FIGS. 1A and 1B, the mutual relationship among the contact 10, and the first and second vias 30 and 50 which allows the solution of the problem described above is limited. On condition that the contact 10 is disposed on the first wiring line 20 so that its one side coincides with one end of the line 20 in position, and the second via 50 is disposed on the second wiring line 40 so that its one side coincides with the other end of the line 40, the first via is disposed in a position which is apart from the second via as far as possible, and which allows the prevention of the occurrence of the misalignment on the one end of the first wiring line which the side of the contact disposed thereon coincides with. However, it is difficult to predict the direction of alignment deviation, and therefore it is insufficient only to factor in the alignment deviation in the longitudinal direction as already considered with reference to FIGS. 9A and 9B. In case that an alignment deviation occurs in a short-side direction of the first wiring line 20, the misalignment ends up occurring on one of the end faces because the short-side direction is equal to the minimum line width. Hence, under the restriction as described with reference to FIGS. 1A and 1B, it is the most preferable to arrange the first via 30 in a position equally apart from the contact 10 and the second via 50.

Assuming the alignment deviation in the short-side direction, a region where the lower titanium film is lost owing to the misalignment inevitably overlaps the top of the first via on condition that the first and second wiring lines 20 and 40 are smaller than triple the minimum line width in length. In such case, the contact resistance of the second wiring line 40 and the first via 30 becomes larger. The alignment deviation arises accompanying a statistical variation including a quantity of the deviation thereof. It is conceivable that the size of a region where the lower titanium film is lost likewise accompanies a statistical variation. Therefore, even in the case of the first and second wiring lines 20 and 40 which are less than triple the minimum line width in length, the drop in the yield owing to a failure as described above can be suppressed by arranging the first via 30 in a position equally apart from the contact 10 and the second via 50.

[Second Embodiment]

Figure 10:
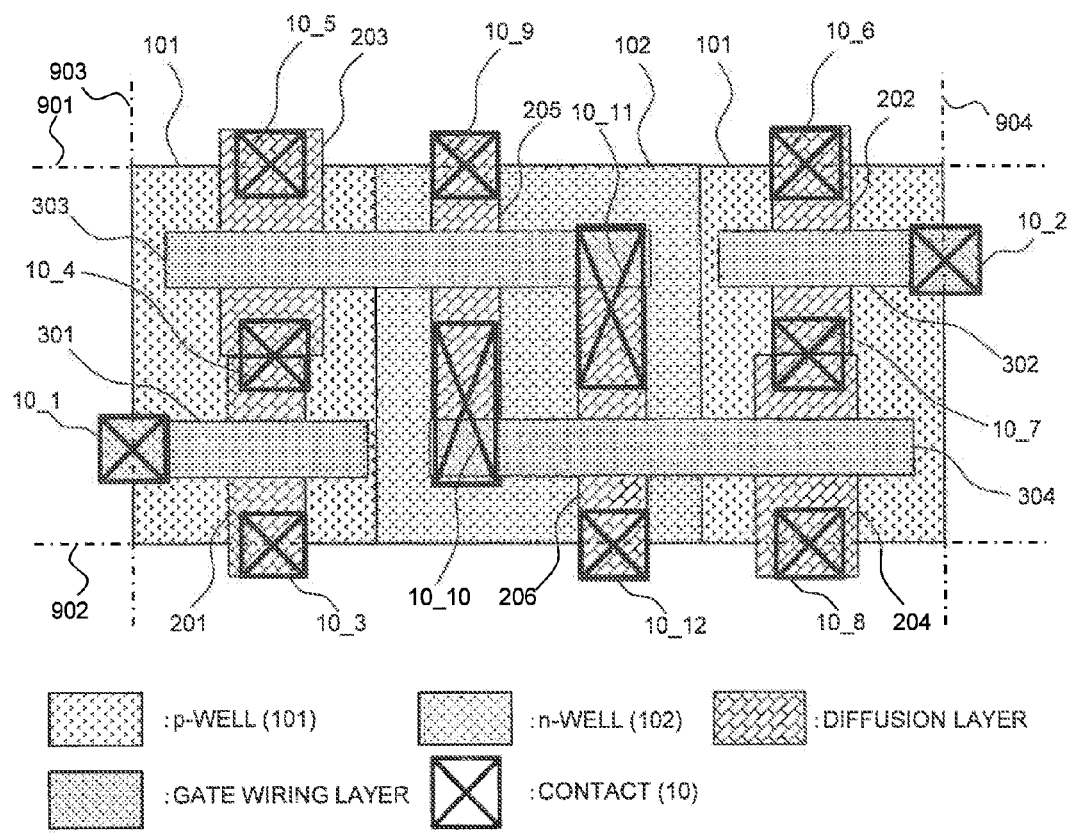
FIG. 10 is a layout illustration of an SRAM memory cell according to the second embodiment of the invention, which includes a well layer, a diffusion layer, a gate wiring layer and a contact layer.
Figure 11:
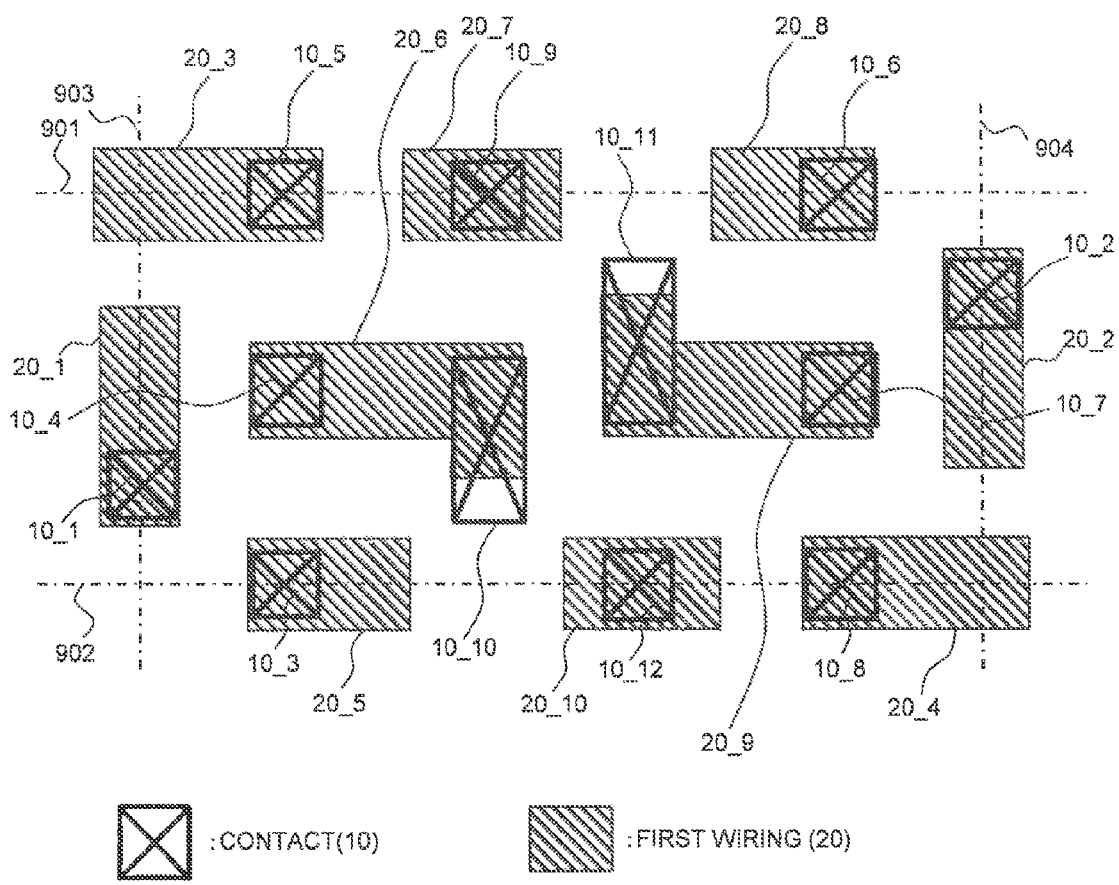
FIG. 11 is a layout illustration of an SRAM memory cell according to the second embodiment of the invention, which includes a contact layer and a first wiring line.
Figure 12:
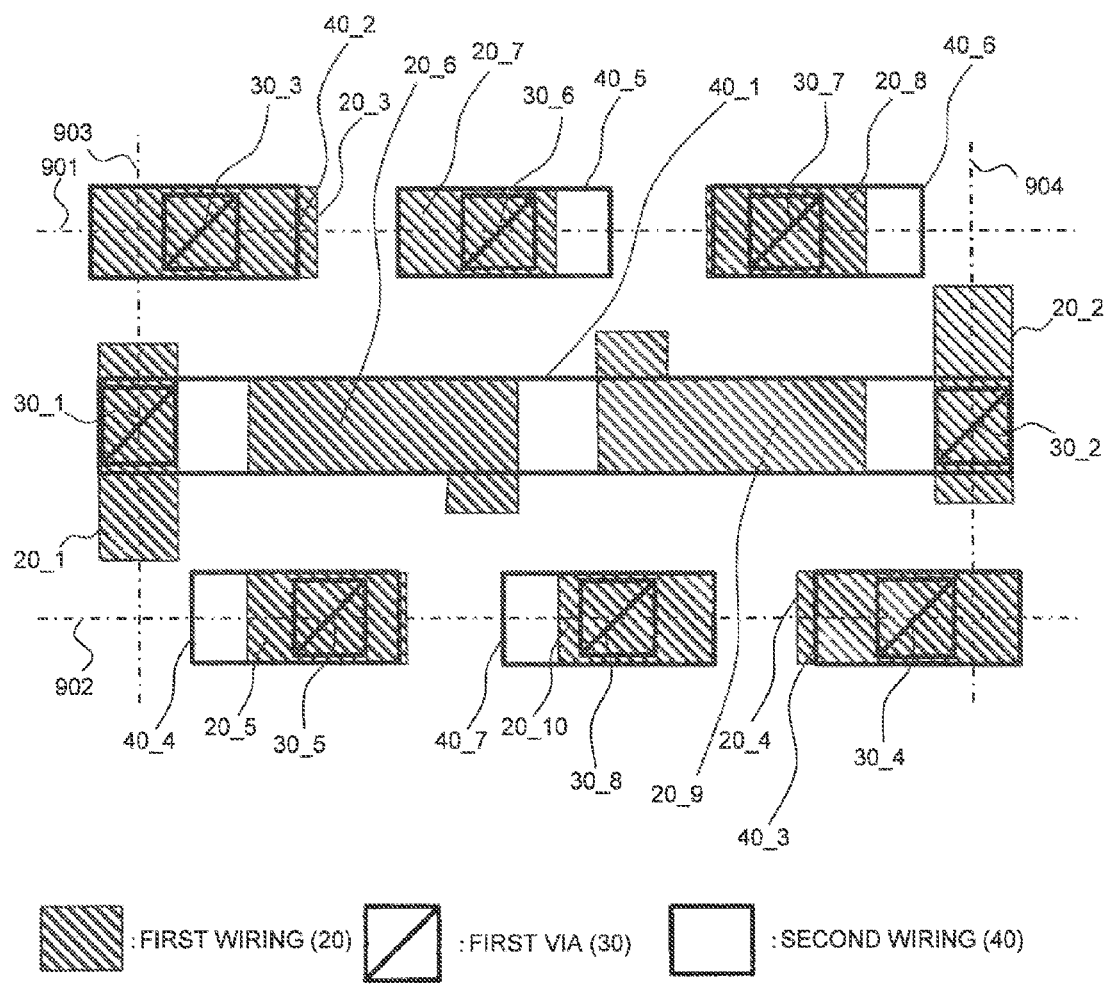
FIG. 12 is a layout illustration of an SRAM memory cell according to the second embodiment of the invention, which includes a first wiring layer, a first via and a second wiring layer.
Figure 13:
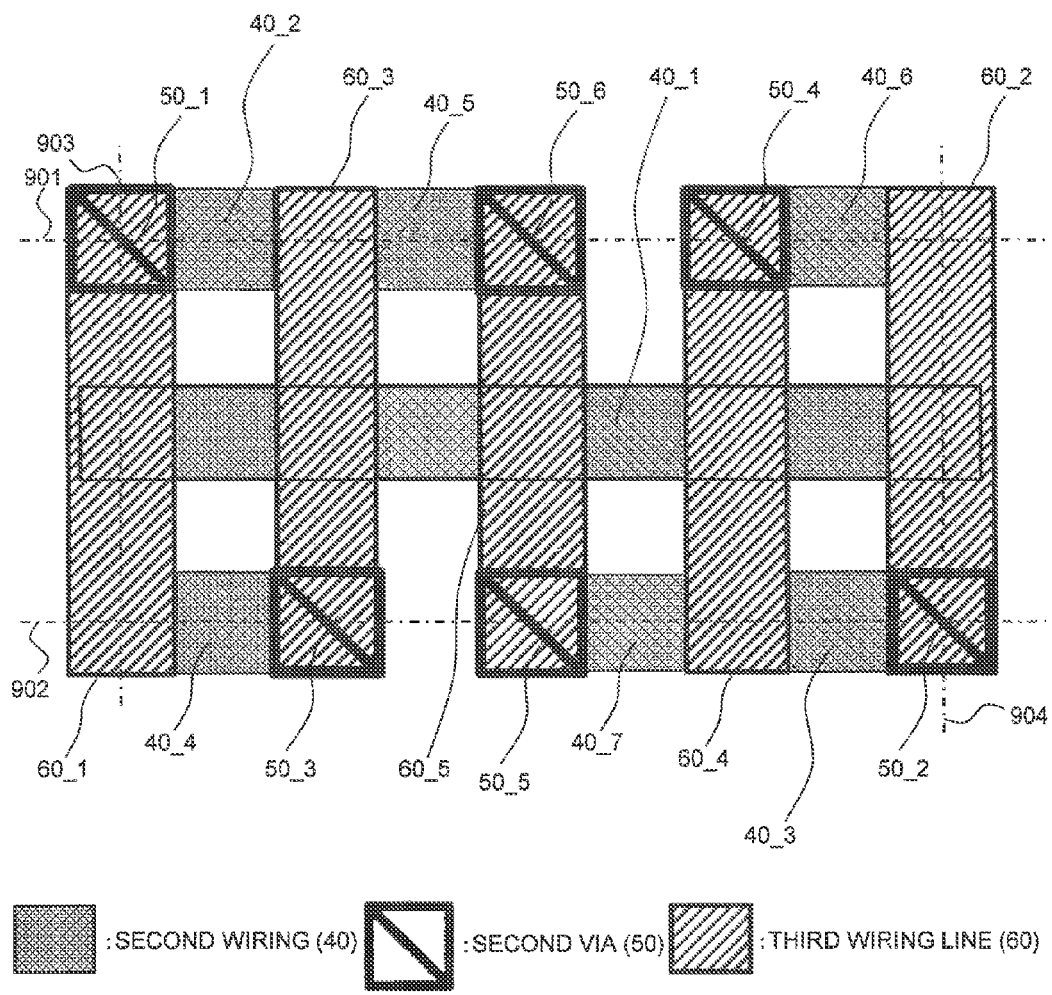
FIG. 13 is a layout illustration of an SRAM memory cell according to the second embodiment of the invention, which includes a second wiring layer, a second via and a third wiring layer.
Figure 14:
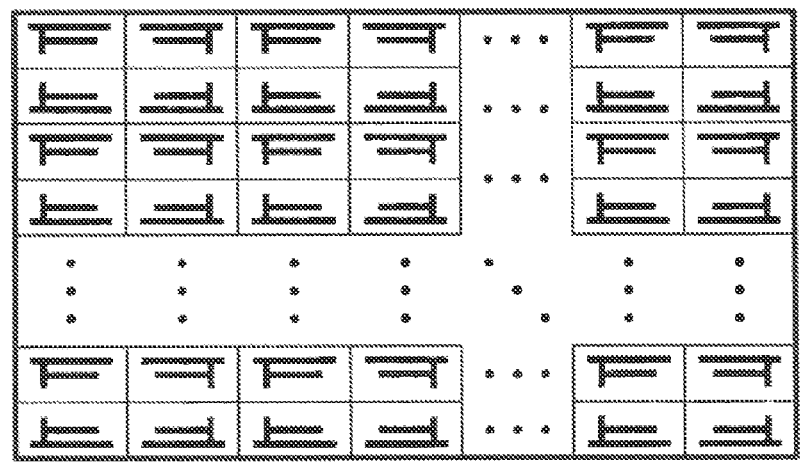
FIG. 14 is a layout illustration showing a memory mat of SRAM formed by arranging memory cells in a matrix form.
Figure 33:
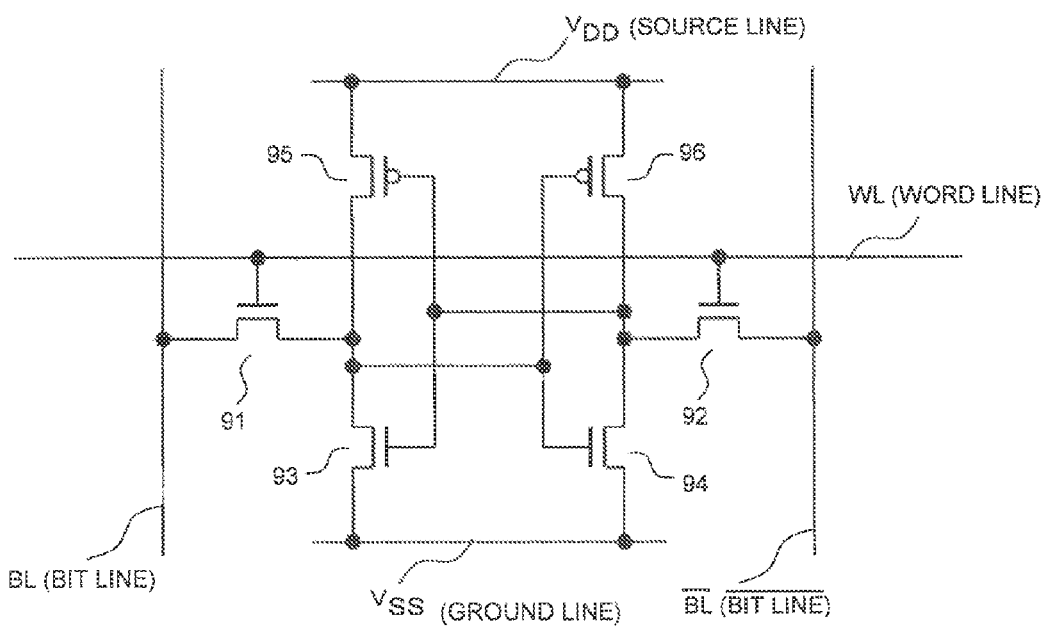
FIG. 33 is a drawing showing the equivalent circuit of a 6-transistor CMOS-SRAM memory cell.

FIGS. 10 to 13 are a layout illustration of a memory cell of SRAM according to the second embodiment of the invention. FIG. 14 is a layout illustration showing an SRAM memory mat formed by the memory cells arranged in a matrix form. FIG. 33 is a diagram showing an equivalent circuit of a 6-transistor CMOS-SRAM memory cell. Shown in FIG. 10 are well layers 101 and 102, diffusion layers 201 to 206, gate wiring lines 301 to 304, and contacts 10_1 to 10_12. In FIG. 11, first wiring lines 20_1 to 20_10 formed by the contact 10_1 to 10_12, and the first wiring layers 20 are shown. In FIG. 12, the first wiring lines 20_1 to 20_10, first vias 30_1 to 30_8, and second wiring lines 40_1 to 40_7 formed by the second wiring layer 40 are shown. In FIG. 13, second wiring lines 40_1 to 40_7, second vias 50_1 to 50_6, and third wiring lines 60_1 to 60_5 formed by the third wiring layers 60 are shown. In FIGS. 10 to 13, the reference numerals 901 to 904 each represent a cell boundary. As shown in FIG. 14, the memory cells are arranged in a matrix form with the cell boundaries coincident with each other, in which adjacent memory cells are arranged so that the layout pattern of one memory cell mirror-inverted about the cell boundary coincides with the layout pattern of the other memory cell. As to a pattern on one cell boundary, e.g. the third wiring line 60_2 located on the rightmost cell boundary, which is shown in FIG. 13, totally coincides with the third wiring line 60_2 of the right-hand adjacent memory cell on condition that the memory cells arranged in a matrix form so that their cell boundaries coincide with each other. This is because the right-hand adjacent cell is mirror-inverted in layout, and the third wiring line 60_2 is located on the leftmost cell boundary thereof. Likewise, the memory cells adjacent to each other in a column direction (i.e. up-and-down direction) are mirror-inverted, and superposed on each other so that their cell boundaries coincide with each other. Consequently, the third wiring lines 60_2 form, as a physical material, one third wiring layer extending between the top end of the memory mat to the bottom end along the column direction.

The SRAM memory cell according to the first embodiment of the invention is a transverse type memory cell including: a word line formed by the second wiring line 40_1 in the row direction; ground lines formed by the third wiring lines 60_1 and 60_2; bit lines which are complementary to each other, and formed by the third wiring lines 60_3 and 60_4; and a source line formed by the third wiring line 60_5. The ground lines, the bit lines, and the source line are formed along the column direction respectively.

in the cell shown in FIG. 10, two n-channel MOSFETs are formed, as a pair of access transistors, by a combination of the diffusion layer 201 and the gate wiring line 301 and a combination of the diffusion layer 202 and the gate wiring line 302. The pair of access transistors correspond to the n-channel MOSFETs 91 and 92 of the equivalent circuit shown in FIG. 33. Further, an inverter is formed by an n-channel MOSFET formed by a diffusion layer 203 and a gate wiring line 303 and a p-channel MOSFET formed by a diffusion layer 205 and a gate wiring line 303, which correspond to an n-channel MOSFET 93 and a p-channel MOSFET 95 in the equivalent circuit shown in FIG. 33. Another inverter is formed by an n-channel MOSFET formed by a diffusion layer 204 and a gate wiring line 304, and a p-channel MOSFET formed by a diffusion layer 206 and a gate wiring line 304, which correspond to an n-channel MOSFET 94 and a p-channel MOSFET 96 in the equivalent circuit shown in FIG. 33. The memory cell is formed by connecting the input/output terminal of one of the two inverters to the output/input terminal of the other inverter. As to the access transistors, the gate terminals thereof are connected to a word line, and drain and source terminals which are not connected with the two inverters are connected to bit lines complementary to each other. The reference numerals 10_1 and 10_2 represent contacts for connecting to the word line; 10_3 and 10_6 represent contacts for connecting bit lines complementary to each other; 10_5 and 10_8 represent contacts for connecting the inverters to the ground line; and 10_9 and 10_12 represent contacts for connecting the inverter to the source line.

In FIG. 11, the contacts 10_1 to 10_12, and the first wiring line are shown. The contacts 10_4, 10_7, 10_10 and 10_11, and the first wiring lines 20_6 and 20_9 form wiring lines for connecting the output of each inverter to the input of the other inverter. The first wiring lines 20_1 and 20_2 connected with the contacts 10_1 and 10_2 are island-like patterns formed by the first wiring layer 20 for connecting to the word line formed by the second wiring line located above them. The first wiring lines 20_5 and 20_8 connected with the contacts 10_3 and 10_6 are island-like patterns formed by the first wiring layer 20 for connecting to the bit lines which are complementary to each other and formed by the second wiring lines located above them. The first wiring lines 20_3 and 20_4 connected with the contacts 10_5 and 10_8 are island-like patterns formed by the first wiring layer 20 for connecting to the ground lines wired by the overlying second wiring line. The first wiring lines 20_7 and 20_10 connected with the contacts 10_9 and 10_12 are island-like patterns formed by the first wiring layer 20 for connecting to the source line wired by the second wiring line located above them.

In FIG. 12, the first wiring lines 20_1 to 20_10, the first vias 30_1 to 30_8 and the second wiring lines 40_1 to 40_7 are shown. The second wiring line 40_1 is a word line, which is arranged to extend between the left-hand cell boundary 903 and the right-hand cell boundary 904 in the row direction, and mutually connected with a word line of the memory cell adjacent to the memory cell of interest in the row direction. The second wiring line 40_1 is connected through the first vias 30_1 and 30_2 to the island-like patterns and the first wiring lines 20_1 and 20_2 which are formed in the first wiring layer 20. Other second wiring patterns in the second wiring layer are island-like patterns, which are connected to the island-like patterns in the first wiring layer through the first vies 30_3, 30_4, 30_5, 30_6, 30_7 and 30_8.

In FIG. 13, the second wiring lines 40_1 to 40_7, the second vies 50_1 to 50_6 and the third wiring lines 60_1 to 60_5 are shown. The second wiring lines 40_1 to 40_7 are connected through the second vias 50_1 to 50_6 to the ground lines 60_1 and 60_2, the bit lines 60_3 and 60_4 and the source line 60_5 formed in the third wiring layer 60.

Figure 15:
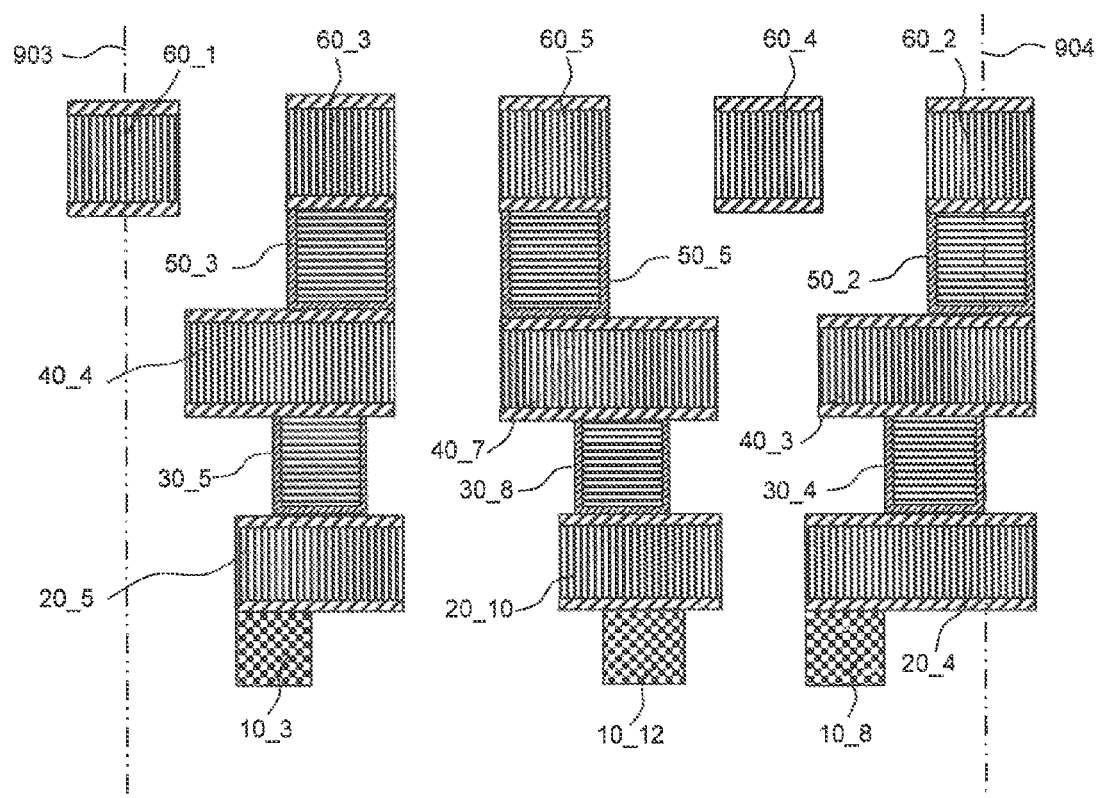
FIG. 15 is a sectional view of an SRAM memory cell according to the second embodiment of the invention at the lower-side cell boundary 902.

FIG. 15 is a sectional view at the lower-side the cell boundary 902 of the SRAM memory cell according to the second embodiment of the invention. In the drawing, only the first and second wiring lines, the contacts, and the first and second vias are shown, and other layers including the substrate, and the interlayer dielectric film are left out.

As for the parts connected with the ground line 60_2, the first and second wiring lines 20_4 and 40_3 are each composed of an island-like pattern which is as large as the minimum line width in width, and two to three times the minimum line width in length, and the second via 50_2 is arranged on one end of the second wiring line 40_3. The second wiring line 40_3 has a width as large as the minimum line width, and sides of the second via 50_2 each have the same size, and the three sides of the second via 50_2 overlap the edge of the end of the second wiring line 40_3. Therefore, the problem of the misalignment occurs in case that an alignment deviation of the second via 50_2 arises in a direction of the width of the second wiring line 40_3 (i.e. in the drawing, the direction from the backside toward the front side perpendicularly to the plane of the drawing sheet, or the opposite direction). Even if the actual minimum processing size of the second wiring layer or the second via are different from the minimum line width, and the side of the second via is somewhat away from the end of the second wiring line, the misalignment occurs according to the statistical variation as long as the gap between the side of the second via and the end of the second wiring line is smaller than the alignment accuracy. As a result of the misalignment, the lower titanium film of the second wiring line 40_3 can be lost partially from where the misalignment occurs. To reduce the influence of the disappearance of the lower titanium film, the first via 30_4 is disposed away from the position right below the second via 50_2 to the left in the drawing. Also, the occurrence of the disappearance of the lower titanium film can begin from any one of the sides opposite to each other in the direction of the width of the wiring line (i.e. in the drawing, the direction from the backside toward the front side perpendicularly to the plane of the drawing sheet, or the opposite direction). On this account, it is desired to place the first via as far away from the second via as possible. As described concerning the relation between the second via 50_2 and the second wiring line 40_3, the disappearance of the lower titanium film of the first wiring line 20_4 can be caused by the misalignment of the first via 30_4 depending on the relation between the first via 30_4 and the first wiring line 20_4. The first via 30_4 is not arranged on the end of the first wiring line 20_4, provided that the end is the left one in the drawing. Therefore, the misalignment does not occur on the left end of the first wiring line 20_4 as long as the first via 30_4 is at a distance of the alignment accuracy or larger from the left end. However, an alignment deviation in the direction of the width of the wiring line (i.e. in the drawing, the direction from the backside toward the front side perpendicularly to the plane of the drawing sheet, or the opposite direction) can cause the misalignment. Take into account that the contact 10_8 is arranged on the left end of the first wiring line 20_4, it is desired to arrange the first via 30_4 as far away from the position of the contact 10_8 as possible for the purpose of minimizing the influence of the disappearance of the lower titanium film of the first wiring line 20_4 owing to the misalignment. Hence, it is the most preferable to arrange the first via 30_4 between the contact 10_8 and the second via 50_2 in a position equally apart from the contact and the second via.

In a case where the memory cell can be designed so that the minimum processing size of the first via layer is smaller than the minimum line width, and one side of the first via 30_4 is smaller than the first wiring line 20_4, even if the alignment deviation of the first via 30_4 to the first wiring line 20_4 occurs, the probability of the occurrence of the misalignment is low. In such case, the probability of suffering the influence of the disappearance of the lower titanium film of the second wiring line 40_3 owing to the misalignment of the second via 50_2 can be reduced by arranging the first via 30_4 in a position displaced further to the left. In a case where the first via 30_4 and the first wiring line 20_4 can be laid out while keeping a margin equal to or larger than the alignment accuracy, the first via 30_4 may be arranged on the left end of the second wiring line 40_3.

As for the parts connected with the bit line 60_3, the first and second wiring lines 20_5 and 40_4 are each composed of an island-like pattern which is as large as the minimum line width in width, and about double the minimum line width in length, and the second via 50_3 is arranged on the right end of the second wiring line 40_4. The second wiring line 40_4 has a width as large as the minimum line width, and sides of the second via 50_3 is the same size as the width and as such, the three sides of the second via 50_3 overlap the end of the second wiring line 40_4. Therefore, the alignment deviation of the second via 50_3 relative to the second wiring line 40_4 causes the problem of the misalignment. The misalignment can cause the lower titanium film of the second wiring line 40_4 to be lost partially from where the misalignment occurs. To reduce the influence of the disappearance of the lower titanium film, the first via 30_5 is disposed away from the position right below the second via 50_3 to the left direction in the drawing. On the other hand, the occurrence of the misalignment of the first via 30_5 can cause the disappearance of the lower titanium film of the first wiring line 20_5. The contact 10_3 is arranged on the left end of the first wiring line 20_5 and as such, it is desired to arrange the first via 30_5 as far away from the position of the contact 10_3 as possible for the purpose of minimizing the influence of the disappearance of the lower titanium film of the first wiring line 20_5 owing to the misalignment. Hence, it is the most desirable to arrange first via 30_5 between the contact 10_3 and the second via 50_3 and if possible, in a position equally apart from the contact and the second via.

Likewise, as for the parts connected with the source line 60_5, the first via 30_8 is disposed in a position equally apart from the second via 50_5 and the contact 10_12.

From the foregoing, the deterioration in the reliability of connection between the metal wiring layer and the via of the underlying layer, and the reduction in the yield owing to the rise in electrical contact resistance can be prevented in the case that the layout rule which permits the misalignment is adopted for a metal wiring layer which has a bottom layer including a titanium film and a via of the upper layer which has a tungsten plug.

[Third Embodiment]

Figure 16:
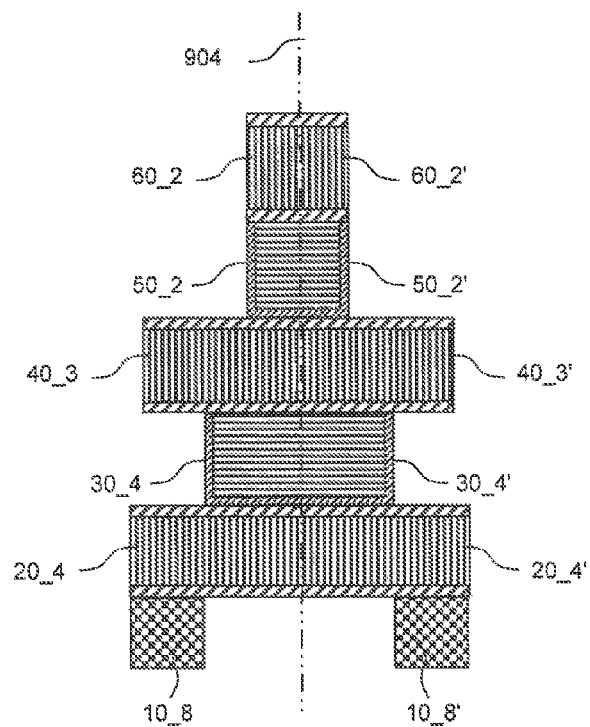
FIG. 16 is a sectional view of parts connected to a ground line, for the sake of explanation which covers the relation between adjacent memory cells.
Figure 17:
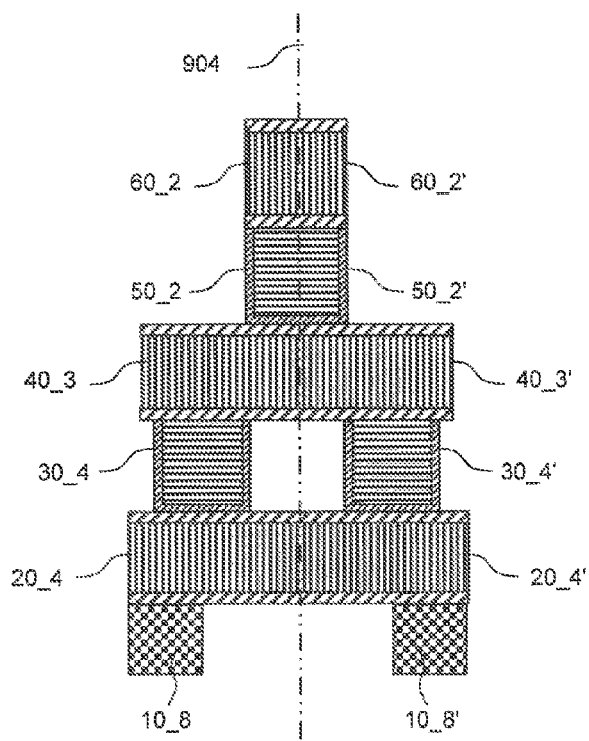
FIG. 17 is a sectional view of the parts connected to a ground line in a memory cell according to the third embodiment, for the sake of explanation which covers the relation between adjacent memory cells.
Figure 18:
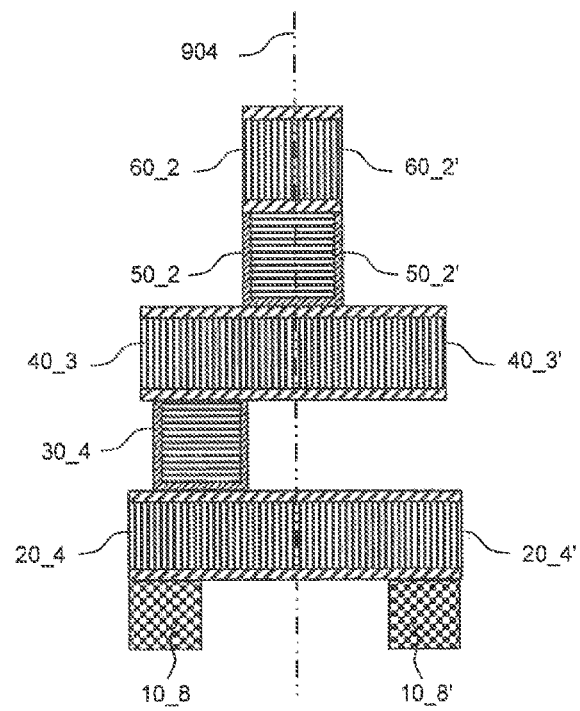
FIG. 18 is a sectional view showing a modification of the memory cell layout of FIG. 17, in which a part corresponding to the first via is not provided in an adjacent cell mirror-inverted in layout.

FIGS. 16, 17 and 18 are sectional views of parts connected to the ground line 60_2, for the sake of explanation which covers the relation between the corresponding parts of adjacent memory cells. The parts shown in FIG. 16 are involved in the memory cell according to the second embodiment shown in FIG. 15. FIGS. 17 and 18 show modifications thereof.

In the drawing, only the first wiring line 20_4, the second wiring line 40_3, the third wiring line 60_2, the contact 10_8, the first via 30_4 and the second via 50_2 are shown as the parts connected to the ground line 60_2. The parts are respectively put together with the corresponding parts of an adjacent cell which is mirror-inverted in layout about the cell boundary 904 serving as the symmetry axis.

As in FIG. 16, the third wiring line 60_2 and the second via 50_2 located on the cell boundary 904 are exactly the same as the corresponding parts of the adjacent cell in pattern. The contact 10_8' is located in the position symmetrical to that of the contact 10_8, and is equivalent to the contact 10_8 mirror-inverted in pattern. The first and second wiring lines 20_4 and 40_3 are respectively put together and connected with the first and second wiring lines 20_4' and 40_3' of the mirror-inverted adjacent cell at the cell boundary, thereby forming long island-like patterns. Likewise, the first via 30_4 is put together and connected with the first via 30_4' of the mirror-inverted adjacent cell at the cell boundary, thereby forming a long pattern.

FIG. 17 shows a modification of the memory cell layout of FIG. 16, wherein the first via 30_4 and the first via 30_4' of the mirror-inverted adjacent cell are not put together at the cell boundary, but spaced apart from each other. This is useful in a case such that the first via 30_4 is not allowed to have a pattern of a form other than a square because of the restriction concerning the aspect ratio.

The double piling as shown in FIG. 17 cannot materialize an adequate size for the first wiring line 20_4 or the second wiring line 40_3. Therefore, in some cases, it is impossible to conform to the design rule which stipulates a spacing between the two first vias. FIG. 18 shows a modification of the memory cell layout, which is different from the layout of FIG. 17 in that the first via 30_4' is not included in the adjacent cell mirror-inverted in layout. This is useful in a case such that the first via 30_4 is not allowed to have a pattern of a form other than a square because of the restriction concerning the aspect ratio, and it is impossible to conform to, by means of the double piling, the design rule which stipulates a spacing between the first vias.

[Effects of the Second to Third Embodiments]

Figure 19:
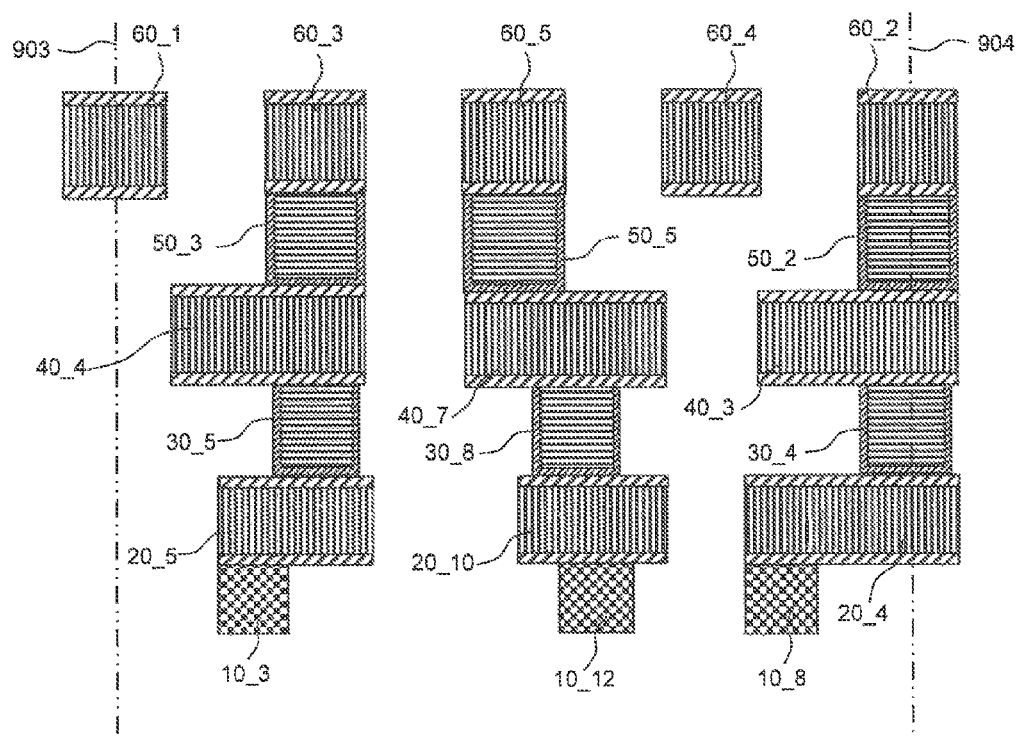
FIG. 19 is a sectional view showing an example of a conventional SRAM memory cell, herein referred to as "example for reference"
Figure 20:
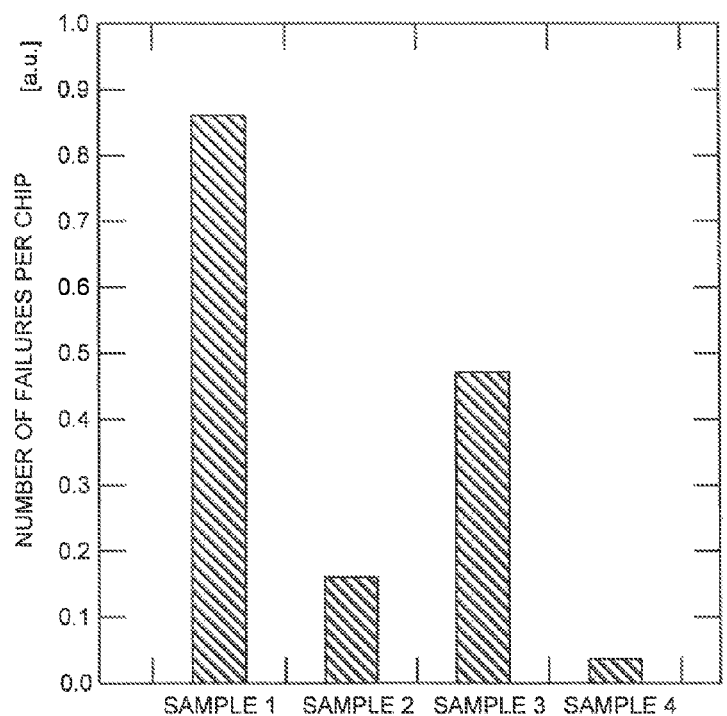
FIG. 20 is a graph showing results of an experiment for determining the rate of failure occurrence per chip for samples.

The rate of failure occurrence was measured concerning some combinations of the modifications of the layout for the first via in connection with the second to third embodiments, and an example of conventional SRAM memory cells, hereinafter referred to as "example for reference", FIG. 19 is a sectional view showing an example for reference. FIG. 20 shows results of measurement of the rate of failure occurrence.

The sample 1 is a conventional SRAM used as an example for reference shown in FIG. 19. The sample 2 is an SRAM, in which adjacent memory cells each have, as a part connected to the ground line 60_2, the first via 30_4 as shown in FIG. 17. In the sample 2, the parts connected to the bit line 60_3 are the same as those in the example for reference (see FIG. 19). The sample 3 is an SRAM, in which the first via 30_8 constituting a part connected to the bit line 60_3 is displaced to the middle between the second via 50_5 and the contact 10_12 as shown in FIG. 15. In the sample 3, the parts connected to the ground line 60_2 are the same as those in the example for reference (see FIG. 19). The sample 4 is an SRAM, in which the first via 30_4 constituting a part connected to the ground line 60_2 is provided in only one of adjacent memory cells as shown in FIG. 18, and the first via 30_8 constituting a part connected to the bit line 60_3 is displaced to the middle between the second via 50_5 and the contact 10_12 as shown in FIG. 15.

FIG. 20 shows results of the experiment for determining the rate of failure occurrence per chip on the samples. Turning to the rate of failure occurrence per chip, both the sample 2 is prepared by taking only the measure for the part connected to the ground line 60_2 on the sample 1 used as the example for reference, and the sample 3 is prepared by taking only the measure for the part connected to the bit line 60_3 on the sample 1 show the effect of reducing the rate of failure occurrence. The sample 4 prepared by taking both the measures shows the lowest rate of failure occurrence.

As described above, it is apparent that the deterioration in the reliability of connection between a metal wiring layer and a via of the underlying layer, and the reduction in the yield owing to the rise in electrical contact resistance can be prevented by the invention in the way as described in the second or third embodiment hereof.

[Fourth Embodiment]

Figure 21:
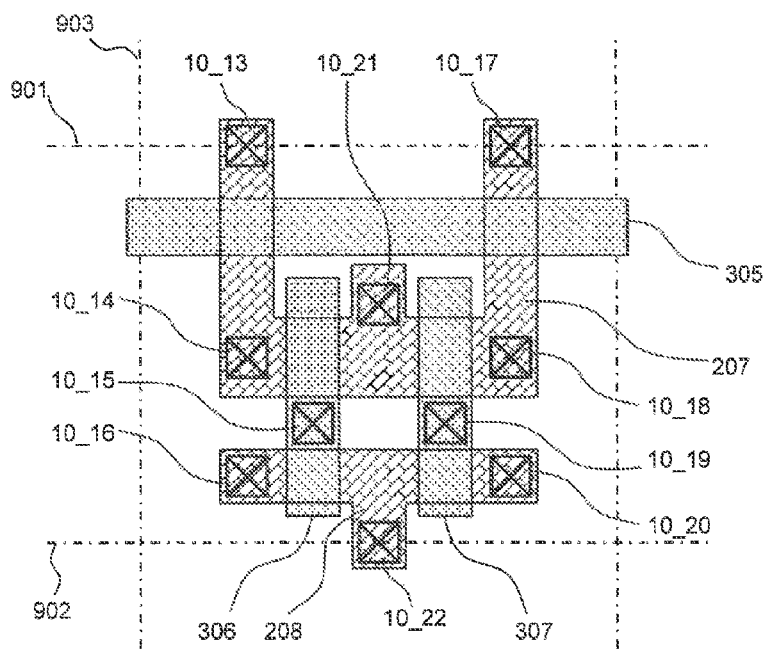
FIG. 21 is a layout illustration of a vertical type memory cell (the diffusion layer, gate wiring layer, and contact layer) of SRAM according to the fourth embodiment of the invention.
Figure 22:
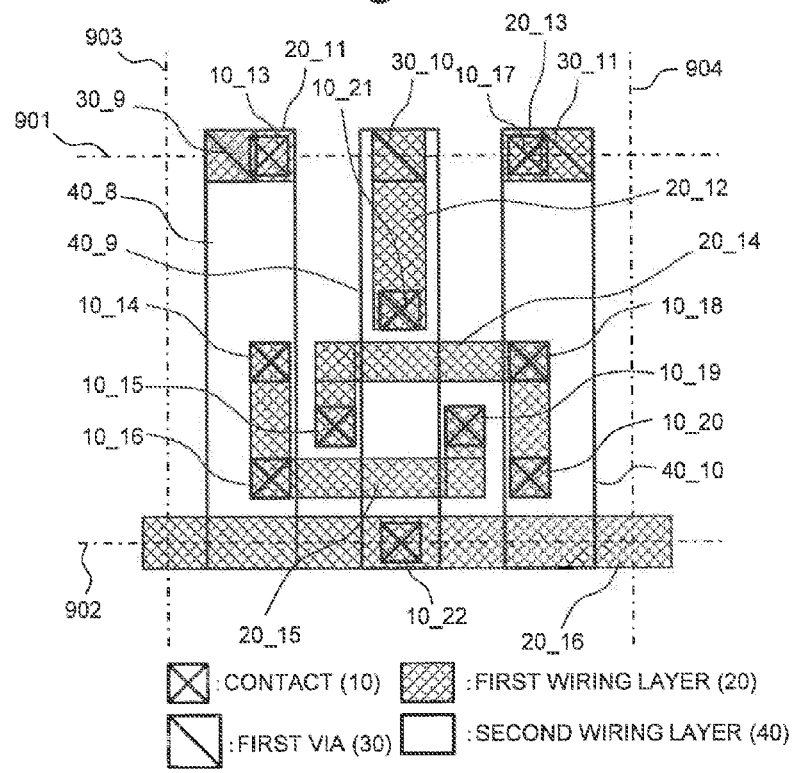
FIG. 22 is a layout illustration of a vertical type memory cell (the contact layer, first wiring layer, first via, and second wiring layer) of SRAM according to the fourth embodiment of the invention.

FIGS. 21 and 22 are each a layout illustration showing a vertical type SRAM memory cell according to the fourth embodiment of the invention. This memory cell is a 6-transistor CMOS-SRAM memory cell, and its equivalent circuit is shown in FIG. 33. In FIG. 21, diffusion layers 207 to 208, gate wiring lines 305 to 307, and contacts 10_13 to 10_22 are shown. Shown in FIG. 22 are first wiring lines 20_11-20_16 formed by the contacts 10_13 to 10_22 and the first wiring layers 20, first vias 30_9 to 30_11, and second wiring lines 40_8 to 40_10 formed by the second wiring layer 40. In FIGS. 21 and 22, the reference numerals 901 to 904 represent cell boundaries. As shown in FIG. 14, the memory cells are arranged in a matrix form with the cell boundaries coincident with each other, in which adjacent memory cells are arranged so that the layout pattern of one memory cell mirror-inverted about the cell boundary therebetween coincides with the layout pattern of the other memory cell.

The SRAM memory cell according to the fourth embodiment of the invention is a vertical type memory cell having: in the row direction, a word line formed by the gate wiring line 305, and a source line formed by the first wiring line 20_16; and in the column direction, a ground line formed by the second wiring line 40_9, and a pair of bit lines which are complementary to each other and formed by the second wiring lines 40_8 and 40_10. The word and source lines may be led up to the third wiring layer outside the cell to connect to the third wiring lines each provided along the row direction.

As in FIG. 21, two n-channel MOSFETs are formed by the diffusion layer 207 and the gate wiring line 305 as a pair of access transistors. The pair of access transistors correspond to the n-channel MOSFETs 91 and 92 of the equivalent circuit shown in FIG. 33. Two inverters are constituted by: n-channel MOSFETs (corresponding to the transistors 93 and 94 of FIG. 33) which include a combination of the diffusion layer 207 and the gate wiring lines 306 and 307; and p-channel MOSFETs (corresponding to the transistors 95 and 96 of FIG. 33) which include a combination of the diffusion layer 208 and the gate wiring lines 306 and 307. The memory cell is formed by connecting the input/output terminal of one inverter to the output/input terminal of the other. The gate wiring line 305 of the pair of access transistors is used as a word line and directly connected to that of the adjacent memory cell, making a wiring line which runs across a memory mat in the row direction. The drain and source terminals which are not connected to the pair of inverters are connected to a pair of bit lines complementary to each other. The reference numerals 10_13 and 10_17 represent contacts for connecting to the pair of bit lines complementary to each other; 10_21 represents a contact for connecting the inverters to the ground line; and 10_22 represents a contact for connecting the inverters to the source line.

In FIG. 22, the contacts 10_13 to 10_22, the first wiring lines 20_11 to 20_16, the first vias 30_9 to 30_11, and the second wiring lines 40_8 to 40_10 are shown. The contacts 10_14 to 10_16 and 10_18 to 10_20, and the first wiring lines 20_14 and 20_15 form wiring lines for connecting the output of each inverter to the input of the other inverter. The first wiring lines 20_11 and 20_13 connected with the contacts 10_13 and 10_17 are island-like patterns formed by the first wiring layer 20, and used for connecting to the bit lines which are complementary to each other, and wired by the second wiring lines 40_8 and 40_10 located above them. The second wiring lines 40_8 and 40_10 are bit lines complementary to each other, and a ground line, which are arranged to extend from the upper end cell boundary 901 to the lower end cell boundary 902 in the column direction, and connected with the corresponding second wiring lines in a memory cell adjacent, in the column direction, to the memory cell of interest respectively. The second wiring line 40_8 is connected through the first via 30_9 to the first wiring line 20_11 of the island-like pattern formed by the first wiring layer 20. The second wiring line 40_10 is connected through the first via 30_11 to the first wiring line 20_13 of the island-like pattern formed by the first wiring layer 20. The second wiring line 40_9 is connected through the first via 30_10 to the first wiring line 20_12.

The first wiring lines 20_11 and 20_13 are each composed of a small island-like pattern having a width as large as the minimum line width, and a length of about 1.1 times the minimum line width; in each first wiring line, the contact 10_13, the first via 30_9, the contact 10_17 and the first via 30_11 are arranged. The first via 30_9 has three sides in touch with the first wiring line 20_11, and is in danger of suffering the occurrence of the misalignment with the three sides. Also, the first via 30_11 has three sides in touch with the first wiring line 20_13, and is in danger of suffering the occurrence of the misalignment with the three sides. Even if the sides of the first via are not perfectly placed on the same lines as the corresponding sides of the first wiring line are, the misalignment can occur as long as the sides of the first via are located near the corresponding sides of the first wiring line with a margin smaller than the alignment margin to ensure the alignment accuracy. It is noted that the phrase "in touch with" implies "near with a margin less than the alignment margin left therebetween". In case that the misalignment has occurred, the disappearance of the lower titanium film of the first wiring line progresses from the side involved in the misalignment, which can cause the rise in the resistance of connection with a contact adjacent thereto or disconnection. This is a problem which is the same as the problem that the inventor found in regard to the first to three embodiments. Hence, the contact 10_13 and the first via 30_9 should be disposed as far away from each other as possible, and the contact 10_17 and the first via 30_11 should be arranged as far away from each other as possible. Thus, the influence of the disappearance of the lower titanium film of the first wiring line can be minimized, and the reduction in the yield can be suppressed.

The first wiring line 20_12 used as the ground line is a long one which has a length several fold the minimum line width. Therefore, the contact 10_21 and the first via 30_10 can be arranged on opposing ends thereof, and the influence of the disappearance of the lower titanium film of the first wiring line is not expected to spread. Likewise, it is expected that the influence of disappearance of the lower titanium film of the first wiring can be avoided by arranging the first wiring lines 20_11 and 20_13 to have a long length comparable to this in the column direction. However, the first wiring lines 20_11 and 20_13 form bit lines complementary to each other and as such, in case that the capacitive coupling between the first wiring lines 20_11 and 20_13 and the word line 305 arranged in the underlying layer thereof becomes larger, the fluctuation in the signal level of the word line can make noise on the bit lines, resulting in the malfunction. On this account, the first wiring lines cannot be arranged to have a size large enough to cover the word line 305.

[Fifth Embodiment]

Figure 23:
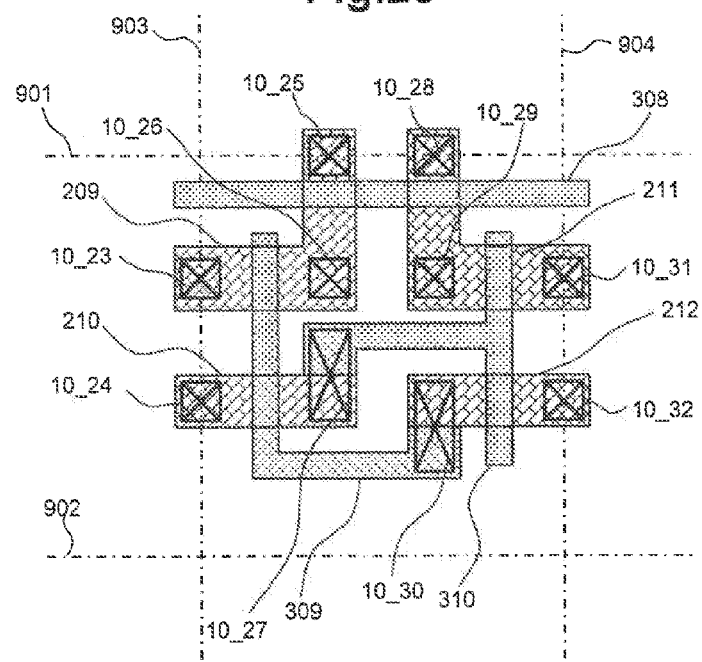
FIG. 23 is a layout illustration of a vertical type memory cell (the diffusion layer, gate wiring layer, and contact layer) of SRAM according to the fifth embodiment of the invention.
Figure 24:
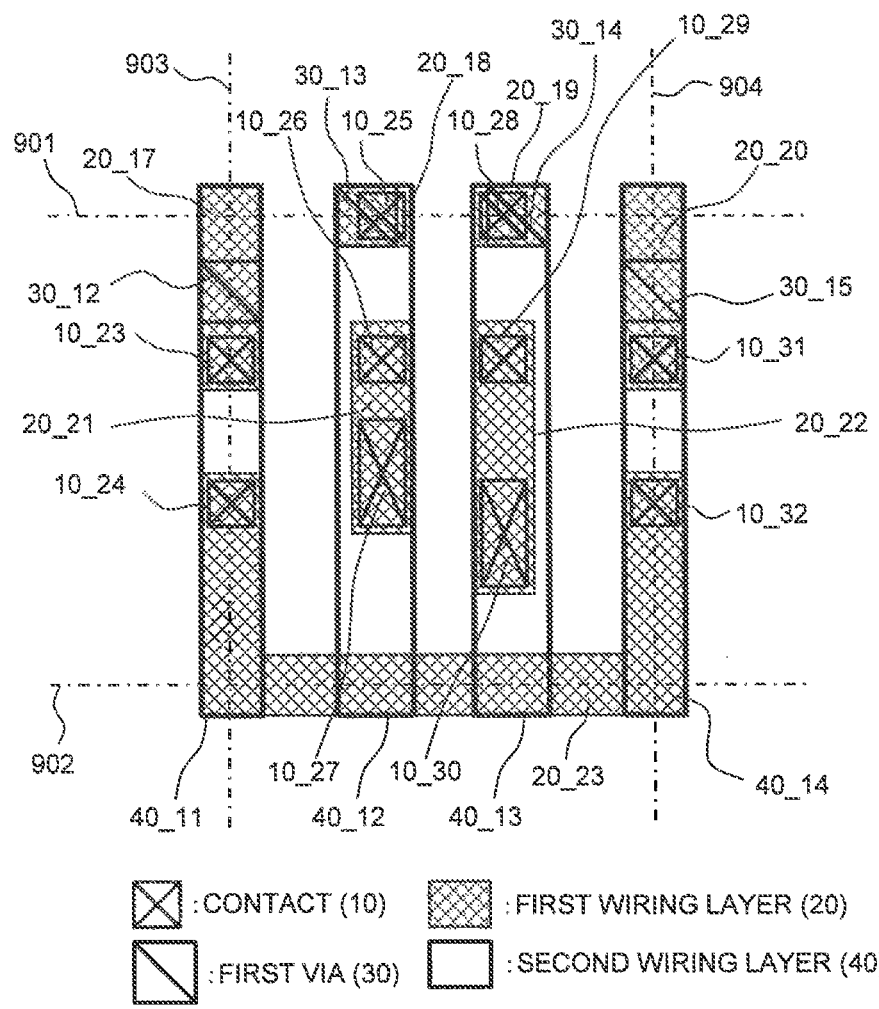
FIG. 24 is a layout illustration of a vertical type memory cell (the contact layer, the first wiring layer, the first via, and the second wiring layer) of SRAM according to the fifth embodiment of the invention.

FIGS. 23 and 24 are layout illustrations of a vertical type memory cell of SRAM according to the fifth embodiment of the invention. The memory cell is also a 6-transistor CMOS-SRAM memory cell, and the equivalent circuit thereof is as shown in FIG. 33. Shown in FIG. 23 are, the diffusion layers 209 to 212, the gate wiring lines 308 to 310, and the contact 10_23 to 10_32. In FIG. 24, the contacts 10_23 to 10_32, the first wiring lines 20_17 to 20_23 formed by the first wiring layer 20, the first vias 30_12 to 30_15, and the second wiring lines 40_11 to 40_1.4 formed by the second wiring layer 40 are shown. In FIGS. 23 and 24, the reference numerals 901 to 904 each represent a cell boundary. As shown in FIG. 14, the memory cells are arranged in a matrix form with the cell boundaries coincident with each other, in which adjacent memory cells are arranged so that the layout pattern of one memory cell mirror-inverted about the cell boundary therebetween coincides with the layout pattern of the other memory cell.

The memory cell of SRAM according to the fifth embodiment of the invention is a vertical type memory cell having: in the row direction, a word line formed by the gate wiring line 308, and a source line formed by the first wiring line 20_23; and in the column direction, ground lines formed by the second wiring lines 40_11 and 40_14, and a pair of bit lines which are complementary to each other and formed by the second wiring lines 40_12 and 40_13. The word and source lines may be led up to the third wiring layer outside the cell to connect to the third wiring lines each provided along the row direction.

In the cell shown in FIG. 23, two n-channel MOSFETs are formed by the diffusion layers 209 and 211, and the gate wiring line 308 as a pair of access transistors. The pair of access transistors correspond to the n-channel MOSFETs 91 and 92 of the equivalent circuit shown in FIG. 33. A pair of inverters are constituted by: n-channel MOSFETs (corresponding to the transistors 93 and 94 of FIG. 33) formed by a combination of the diffusion layer 209 and the gate wiring line 309 and a combination of the diffusion layer 211 and the gate wiring line 310, respectively; and p-channel MOSFETs (corresponding to the transistors 95 and 96 of FIG. 33) formed by a combination of the diffusion layer 210 and the gate wiring line 309, and a combination of the diffusion layer 212 and the gate wiring line 310, respectively. The memory cell is formed by connecting the input/output terminal of one inverter to the output/input terminal of the other. The gate wiring line 308 of the pair of access transistors is used as a word line and directly connected to that of the adjacent memory cell, making a wiring line which runs across a memory mat in the row direction. The drain and source terminals which are not connected to the pair of inverters are connected to a pair of bit lines complementary to each other. The reference numerals 10_25 and 10_28 represent contacts for connecting to the pair of bit lines complementary to each other; 10_23 and 10_31 represent contacts for connecting the inverters to the ground line; and 10_24 and 10_32 represent contacts for connecting the inverters to the source line.

In FIG. 24, the contacts 10_23 to 10_32, the first wiring lines 20_17 to 20_23, the first vias 30_12 to 30_15, and the second wiring lines 40_11 to 40_14 are shown. The contacts 10_26, 10_27, 10_29 and 10_30, and the first wiring lines 20_21 and 20_22 form wiring lines for connecting the output of each inverter to the input of the other inverter. The first wiring lines 20_18 and 20_19 connected with the contacts 10_25 and 10_28 are each composed of an island-like pattern formed by the first wiring layer 20, and used for connecting to the bit lines complementary to each other; the bit lines are formed by the second wiring lines 40_12 and 40_13 located above the first wiring lines. The second wiring lines 40_11 to 40_14 are bit lines complementary to each other, and a ground line, which are arranged to extend from the upper end cell boundary 901 to the lower end cell boundary 902 in the column direction, and connected with the corresponding second wiring lines in a memory cell adjacent, in the column direction, to the memory cell of interest respectively. The second wiring lines 40_11 and 40_14 are connected through the first vias 30_12 and 30_15 to the first wiring lines 20_17 and 20_20 respectively. The second wiring line 40_12 is connected through the first via 30_13 to the first wiring line 20_18 of the island-like pattern formed by the first wiring layer 20. The second wiring line 40_13 is connected through the first via 30_14 to the first wiring line 20_19 of the island-like pattern formed by the first wiring layer 20.

The first wiring lines 20_18 and 20_19 are each composed of a small island-like pattern having a width as large as the minimum line width, and a length of about 1.1 times the minimum line width; in each first wiring line, the contact 10_25, the first via 30_13, the contact 10_28 and the first via 30_14 are arranged. The first via 30_13 has three sides in touch with first wiring line 20_18, and the misalignment can occur with the three sides. Likewise, the first via 30_14 has three sides in touch with the first wiring line 20_19, and the misalignment can occur with the three sides. If the misalignment occurs, the disappearance of the lower titanium film of the first wiring line progresses from the side involved in the misalignment, which can cause the rise in the resistance of connection with a contact adjacent thereto or disconnection. This is the same problem as the inventor found in regard to the first to three embodiments. Hence, the contact 10_25 and the first via 30_13 should be arranged as far away from each other as possible, and also the contact 10_28 and the first via 30_14 should be arranged as far away from each other as possible. Thus, the influence of the disappearance of the lower titanium film of the first wiring line can be minimized, and the reduction in the yield can be suppressed.

The first vias 30_12 and 30_15 for connecting the ground lines to the second wiring lines 40_11 and 40_14 may be arranged, in the first wiring lines 20_17 and 20_20, at intersecting points between the cell boundary 901 and the first wiring lines 20_17 and 20_20 as in the cell according to the seventh embodiment to be later described with reference to FIG. 29. In this way, the distances to the contacts 10_23 and 10_31 can be made larger. Consequently, the reduction in the yield owing to the rise in the resistance or disconnection at the contacts 10_23 and 10_31, which is attributed to the disappearance of the lower titanium layer in each of the first wiring lines 20_17 and 20_20 can be suppressed. According to this embodiment, also in the adjacent memory cell located above the cell boundary 901 in the drawing, the same first via can be placed in a position symmetrical about the cell boundary 901, and therefore a parasitic resistance component produced by the first via can be suppressed.

[Sixth Embodiment]

Figure 25:
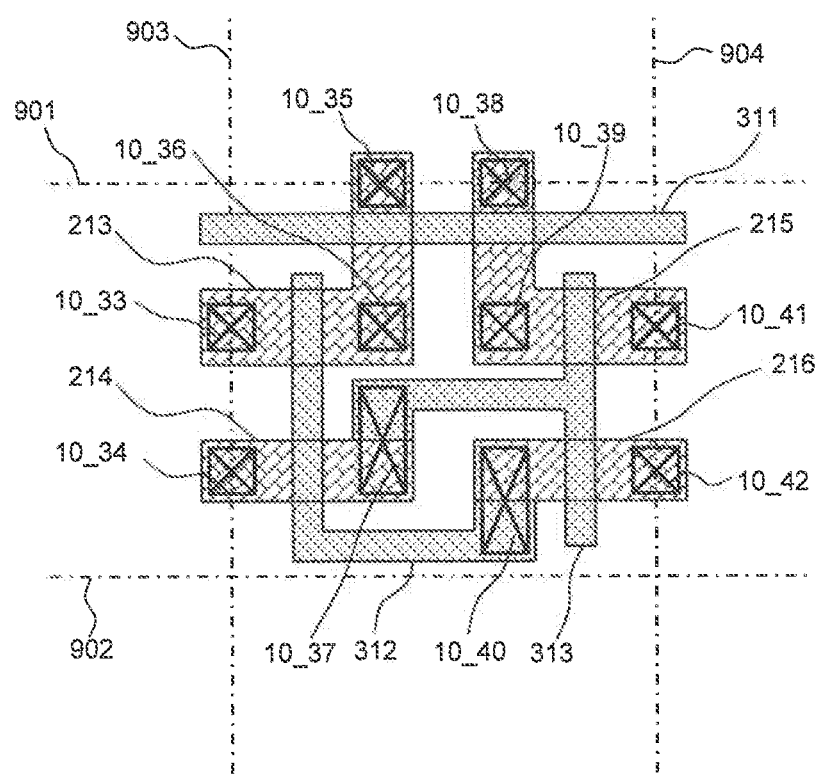
FIG. 25 is a layout illustration of a vertical type memory cell (the diffusion layer, the gate wiring layer, and the contact layer) of SRAM according to the sixth embodiment of the invention.
Figure 26:
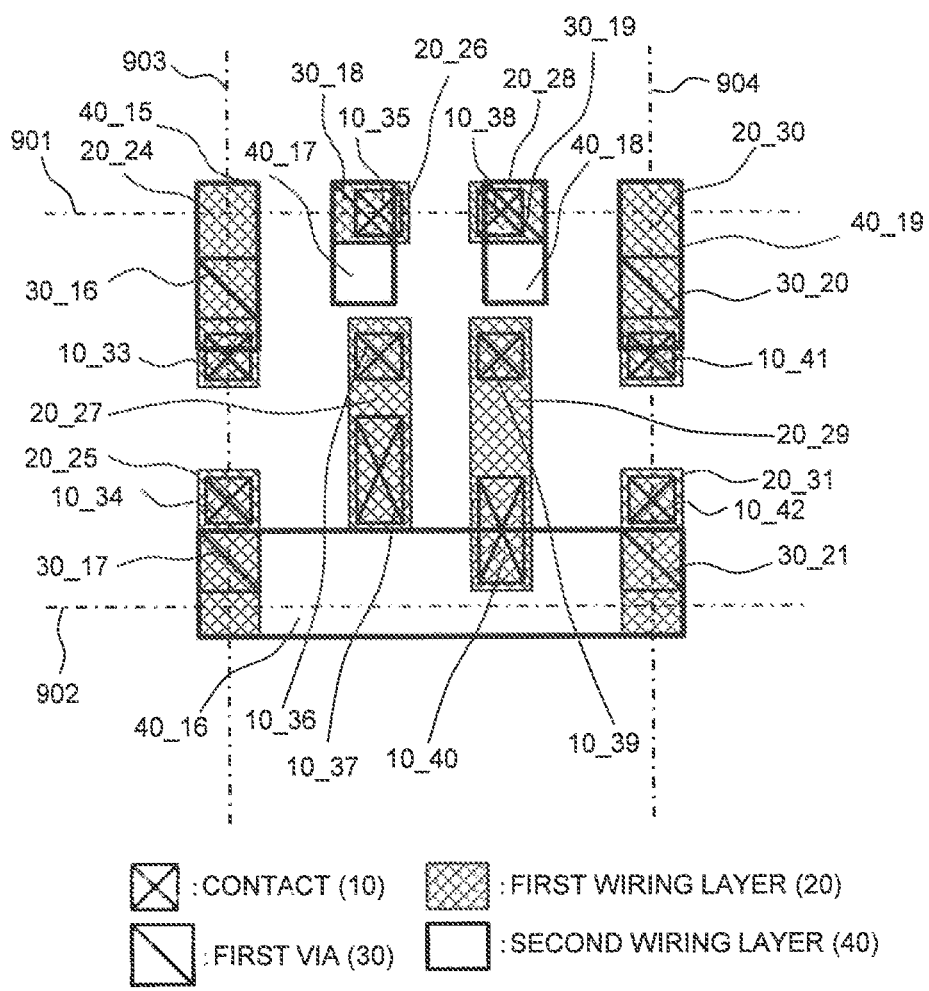
FIG. 26 is a layout illustration of a vertical type memory cell (the contact layer, the first wiring layer, the first via, and the second wiring layer) of SRAM according to the sixth embodiment of the invention.
Figure 27:
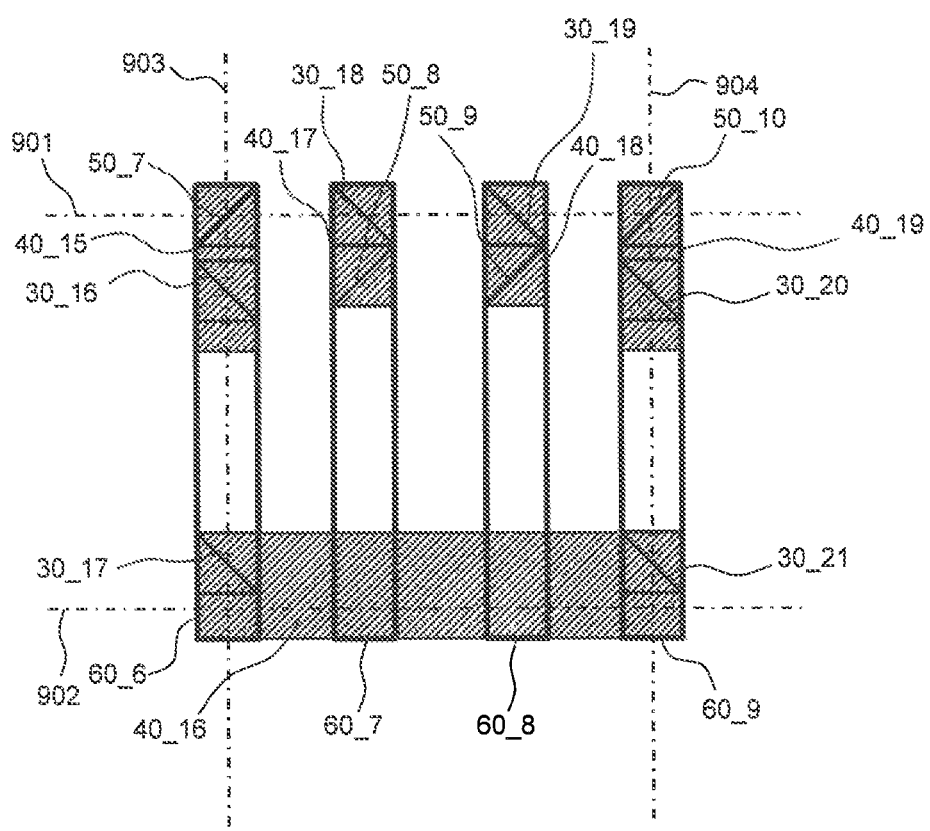
FIG. 27 is a layout illustration of a vertical type memory cell (the first via, the second wiring layer, the second via, and the third wiring layer) of SRAM according to the sixth embodiment of the invention.

FIGS. 25 to 27 are each a layout illustration of a vertical type memory cell of SRAM according to the sixth embodiment of the invention. Also, this memory cell is a 6-transistor CMOS-SRAM memory cell, and the equivalent circuit thereof is as shown in FIG. 33. In FIG. 25, the diffusion layers 213 to 216, the gate wiring lines 311 to 313, and the contacts 10_33 to 10_42 are shown. Shown in FIG. 26 are: the first wiring lines 20_24 to 20_31 formed by the contacts 10_33 to 10_42 and the first wiring layer 20; the first vias 30_16 to 30_21; and the second wiring lines 40_15 to 40_19 formed by the second wiring layer 40. In FIG. 27, the first vias 30_16 to 30_21, the second wiring lines 40_15 to 40_19, the second vias 50_7 to 50_10 and the third wiring lines 60_6 to 60_9 formed by the third wiring layer 60 are shown. In FIGS. 25 to 27, the reference numerals 901 to 904 each represent a cell boundary. As shown in FIG. 14, the memory cells are arranged in a matrix form with the cell boundaries coincident with each other, in which adjacent memory cells are arranged so that the layout pattern of one memory cell mirror-inverted about the cell boundary therebetween coincides with the layout pattern of the other memory cell.

The SRAM memory cell according to the sixth embodiment of the invention is a vertical type memory cell having a word line formed by the gate wiring line 311, and a source line formed by the second wiring line 40_11, each arranged in the row direction; and a pair of bit lines which are complementary to each other and formed by the third wiring lines 60_7 and 60_8, and ground lines formed by the third wiring lines 60_6 and 60_9, each arranged in the column direction.

In FIG. 25, two n-channel MOSFETs are formed by the diffusion layers 213 and 215, and the gate wiring line 311 as a pair of access transistors. The pair of access transistors correspond to the n-channel MOSFETs 91 and 92 of the equivalent circuit shown in FIG. 33. A pair of inverters are constituted by: n-channel MOSFETs (corresponding to the transistors 93 and 94 of FIG. 33) formed by a combination of the diffusion layer 213 and the gate wiring line 312 and a combination of the diffusion layer 215 and the gate wiring line 313, respectively; and p-channel MOSFETs (corresponding to the transistors 95 and 96 of FIG. 33) formed by a combination of the diffusion layer 214 and the gate wiring line 312 and a combination of the diffusion layer 216 and the gate wiring line 313, respectively. The memory cell is formed by connecting the input/output terminal of one inverter to the output/input terminal of the other. The gate wiring line 311 of the pair of access transistors is used as a word line and directly connected to that of the adjacent memory cell, making a wiring line which runs across a memory mat in the row direction. The drain and source terminals which are not connected to the pair of inverters are connected to a pair of bit lines complementary to each other. The reference numerals 10_35 and 10_38 represent contacts for connecting to the pair of bit lines complementary to each other; 10_33 and 10_41 represent contacts for connecting the pair of inverters to the ground lines; and 10_34 and 10_42 represent contacts for connecting the pair of inverters to the source line.

In FIG. 26, the contacts 10_33 to 10_42, the first wiring lines 20_24 to 20_31, the first vias 30_16 to 30_21, and the second wiring lines 40_15 to 40_19 are shown. The contacts 10_36, 10_37, 10_39 and 10_40 and the first wiring lines 20_27 and 20_29 form wiring lines for connecting the output of each inverter to the input of the other inverter. The contacts 10_35 and 10_38, the first wiring lines 20_26 and 20_28, the first vias 30_18 and 30_19, and the second wiring lines 40_17 and 40_18 form wiring lines for connecting to the overlying layer, i.e. the pair of bit lines which are complementary to each other and formed by the third wiring lines 60_7 and 60_8. The first wiring lines 20_26 and 20_28 are each composed of an island-like pattern formed by the first wiring layer 20. The second wiring lines 40_17 and 40_18 are composed of island-like patterns formed by the second wiring layer 40. The contacts 10_33 and 10_41, the first wiring lines 20_24 and 20_30, the first vias 30_16 and 30_20, and the second wiring lines 40_15 and 40_19 form wiring lines for connecting to the overlying layer, i.e. the ground lines formed by the third wiring lines 60_6 and 60_9. The first wiring lines 20_24 and 20_30 are each composed of an island-like pattern formed by the first wiring layer 20. The second wiring lines 40_15 and 40_19 are composed of island-like patterns formed by the second wiring layer 40. The second wiring line 40_16 is a source line which extends from the left-hand cell boundary 903 to the right-hand cell boundary 904 in the row direction, and which is connected to the source line of an adjacent memory cell in the row direction. The second wiring line 40_16 is connected through the first vias 30_17 and 30_21 to the first wiring lines 20_25 and 20_31. The first wiring lines 20_25 and 20_31 are each composed of an island-like pattern formed by the first wiring layer 20.

In FIG. 27, the first vias 30_16 to 30_21, the second wiring lines 40_15 to 40_19, second vias 50_7 to 50_10, and the third wiring lines 60_6 to 60_9 formed by the third wiring layer 60 are shown. The third wiring lines 60_6 to 60_9 are a pair of bit lines complementary to each other and ground lines, which extend from the upper end cell boundary 901 to the lower end cell boundary 902 in the column direction, and which are connected with the corresponding wiring lines of an adjacent memory cell in the column direction. The third wiring lines 60_7 and 60_8 are connected through the second vias 50_8 and 50_9 to the second wiring lines 40_17 and 40_18. The third wiring lines 60_6 and 60_9 are connected through the second vias 50_7 and 50_10 to the second wiring lines 40_15 and 40_19. The second wiring lines 40_15, 40_17, 40_18 and 40_19 are composed of island-like patterns formed by the second wiring layer 40.

The first wiring lines 20_26 and 20_28 are each composed of a small island-like pattern having a width as large as the minimum line width, and a length of about 1.1 times the minimum line width. In the line 20_26, the contact 10_35 and the first via 30_18 are arranged; in the line 20_28, the contact 10_38 and the first via 30_19 are arranged. The first via 30_18 has two sides in touch with the first wiring line 20_26, and the misalignment can occur with the two sides. Likewise, the first via 30_19 has two sides in touch with first wiring line 20_28, the misalignment can occur with the two sides. If the misalignment occurs, the disappearance of the lower titanium film of the first wiring line progresses from the side involved in the misalignment, which can cause the rise in the resistance of connection with a contact adjacent thereto or disconnection. This is the same problem as the inventor found in regard to the first to three embodiments. Hence, the contact 10_35 and the first via 30_18 should be disposed as far away from each other as possible, and also the contact 10_38 and the first via 30_19 should be disposed as far away from each other as possible. Thus, the influence of disappearance of the lower titanium film of the first wiring line can be minimized, and the reduction in the yield can be suppressed.

The second wiring lines 40_17 and 40_18 are each composed of an island-like pattern having a width as large as the minimum line width, and a length of about double the minimum line width. In the line 40_17, the first via 30_18 and the second via 50_8 are arranged; in the line 40_18, the first via 30_19 and the second via 50_9 are arranged. The second via 50_8 has three sides in touch with the second wiring line 40_17, and the misalignment can occur with the three sides. Likewise, the second via 50_9 has three sides in touch with second wiring line 40_18, and the misalignment can occur with the three sides. If the misalignment occurs, the disappearance of the lower titanium film of the second wiring line progresses from the side involved in the misalignment, which can cause the rise in the resistance of connection with a contact adjacent thereto or disconnection. This is the same problem as the inventor found in regard to the first to three embodiments as described above concerning the relation between the contacts and the first vias. Hence, the first via 30_18 and the second via 50_8 should be disposed as far away from each other as possible, and also the first via 30_19 and the second via 50_9 should be disposed as far away from each other as possible. Thus, the influence of disappearance of the lower titanium film of the second wiring line can be minimized, and the reduction in the yield can be suppressed. Further, in comparison to a layout according to the prior art such that the second vias 50_8 and 50_9 are arranged on the cell boundary 901, the resistances associated with the second vias 50_8 and 50_9 can be held down. Incidentally, in a layout such that the second vias 50_8 and 50_9 are both arranged on the cell boundary 901, the second vias 50_8 and 50_9 coincide in position with the corresponding second vias 50_8 and 50_9 of an adjacent memory cell on the upper side of the cell boundary 901 in the drawing and as such, one second via for each bit line is shared by two memory cells arrayed to be adjacent to each other in the up and down direction in the drawing. In contrast, according to the present invention, the second vias 50_8 and 50_9 are disposed away from the cell boundary 901 as described in this embodiment, and the second vias 50_8 and 50_9 are disposed in each of two memory cells adjacent to each other in the up and down direction. Consequently, two second vias are provided for each bit line. Since the two second vias are connected in parallel to each other, the resistance component thereof becomes one half in combination. Even if one of the two vias is disconnected or increased in resistance, SRAM works properly as long as the resistance of the other via is sufficiently small and as such, the effect of further suppressing the reduction in the yield is also brought about.

In regard to parts connected to the third wiring line 60_6 serving as a ground line, the first and second wiring lines 20_24 and 40_15 are each composed of an island-like pattern having a width as large as the minimum line width and a length of two to three times the minimum line width, and the second via 50_7 is disposed on one end of the second wiring line 40_15.

The second wiring line 40_15 has a width as large as the minimum line width, and one side of the second via 50_7 has the same size, and two sides of the second via 50_7 on the right and left overlap the end of the second wiring line 40_15. Therefore, if there is an alignment deviation of the second via 50_7 on the second wiring line 40_15 in the horizontal direction in the drawing, the problem of the misalignment is caused. Even if the actual minimum processing size of the second wiring layer or the second via is different from the minimum line width and as such, the side of the second via is somewhat away from the end of the second wiring line, the misalignment as described above can be caused according to the statistical variation as long as the gap between the side of the second via and the end of the second wiring line is smaller than the alignment accuracy. As a result of the misalignment, the lower titanium film of the second wiring line 40_15 can start disappearing from where the misalignment occurs. To reduce the influence of the disappearance of the lower titanium film, the first via 30_16 is disposed away from the position right below the second via 50_7 downward in the drawing. The misalignment can be caused on the left or right side of the second via. In such a case, the disappearance of the lower titanium film can start from the left or right side where the misalignment occurs, and spread. On this account, it is desired to dispose the first via as far away from the second via as possible. The relation between the first via 30_16 and the first wiring line 20_24 can be considered in the same way as the relation between the second via 50_7 and the second wiring line 40_15. That is, the misalignment of the first via 30_16 can cause the disappearance of the lower titanium film of the first wiring line 20_24. While the first via 30_16 is disposed to be in touch with neither of the upper and lower ends of the first wiring line 20_24, the displacement to the left or right can cause the misalignment. The contact 10_33 is disposed on the lower end of the first wiring line 20_24. Therefore, to minimize the influence of the disappearance of the lower titanium film of the first wiring line 20_24 owing to the misalignment, it is desired to dispose the first via 30_16 as far away from the position of the contact 10_33 as possible. Hence, it is the most preferable to arrange the first via 30_16 between the contact 10_33 and the second via 50_7 and if possible, in a position equally apart from the contact 10_33 and the second via 50_7.

Also, the parts connected to the third wiring line 609 serving as a ground line are arranged exactly in the same way. It is the most preferable to arrange the first via 30_20 between the contact 10_41 and the second via 50_10 and if possible, in a position equally apart from the contact 10_41 and the second via 50_10.

[Modification of Sixth Embodiment]

The parts connected to the third wiring line 60_6 serving as one ground line may be arranged so that the first via 30_16 is disposed on the cell boundary 901, and the second via 50_7 is placed on the end of the second wiring line 40_15 on the lower side thereof in FIGS. 26 and 27. In case that the misalignment of the second via 50_7 on the lower end of the second wiring line 40_15 is caused, the disappearance of the lower titanium film of the second wiring line 40_15 starts from, of the three sides of the lower end of the second wiring line 40_15, the side on which the misalignment has occurred. Arranging the first via 30_16 on the cell boundary 901 as described above, the first via can be arranged so as to be as far away from where the disappearance of the lower titanium film starts, i.e. the three sides of the lower end of the second wiring line 40_15, as possible. Consequently, the influence of the disappearance of the lower titanium film can be minimized. Likewise, the parts connected to the third wiring line 60_9 which is the other ground line may be arranged so that the first via 30_20 is disposed on the cell boundary 901, and the second via 50_10 is disposed on the lower end of the second wiring line 40_19, thereby bringing about exactly the same effect.

In one memory cell, the contact 10_33 and the second, via 50_7 are laid out close to each other, and the contact 10_41 and the second via 50_10 are laid out close to each other. Even so, if the misalignment occurs on the second vias 50_7 and 50_10, the misalignment does not affect the electrical connection of the contact 10_33 and the first wiring line 20_24, and the electrical connection of the contact 10_41 and the first wiring line 20_30 and therefore, no problem arises.

Further, the same problem is solved by arranging the first via between the second via and a contact of the adjacent memory cell instead of arranging, in one memory cell, the first via between the second via and the contact.

in this modification, even in a case such that the island-like first wiring lines 20_24 and 20_30, and the island-like second wiring lines 40_15 and 40_19 are short in length, the effect of suppressing the reduction of the yield is large. The reason for this is as follows. It suffices to arrange each first via 30_16, 30_20 between the second via and a contact (10_33, 10_41) of the adjacent cell in the condition that each island-like first wiring line (20_24, 20_30) is connected with the corresponding first wiring line of an adjacent cell and therefore, each island-like second wiring line (40_15, 40_19) is connected with the corresponding second wiring line of the adjacent cell and as such, the respective parts can be laid out so that the distance between the first via and the second via, and the distance between the first via and the contact are larger than those in the sixth embodiment.

[Seventh Embodiment]

Figure 28:
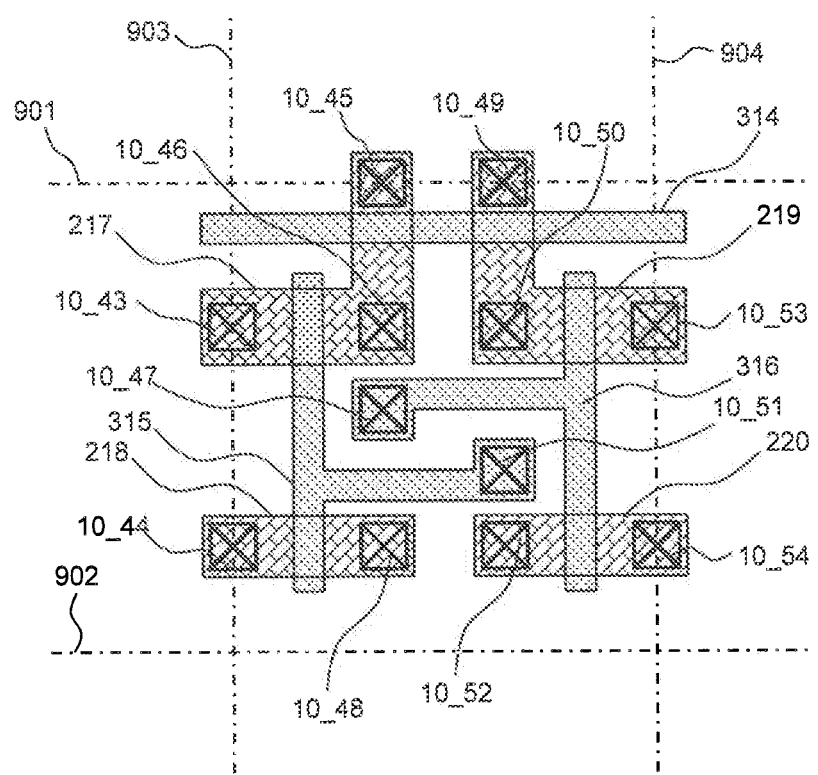
FIG. 28 is a layout illustration of a vertical type memory cell (the diffusion layer, gate wiring layer, and contact layer) of SRAM according to the seventh embodiment of the invention.
Figure 29:
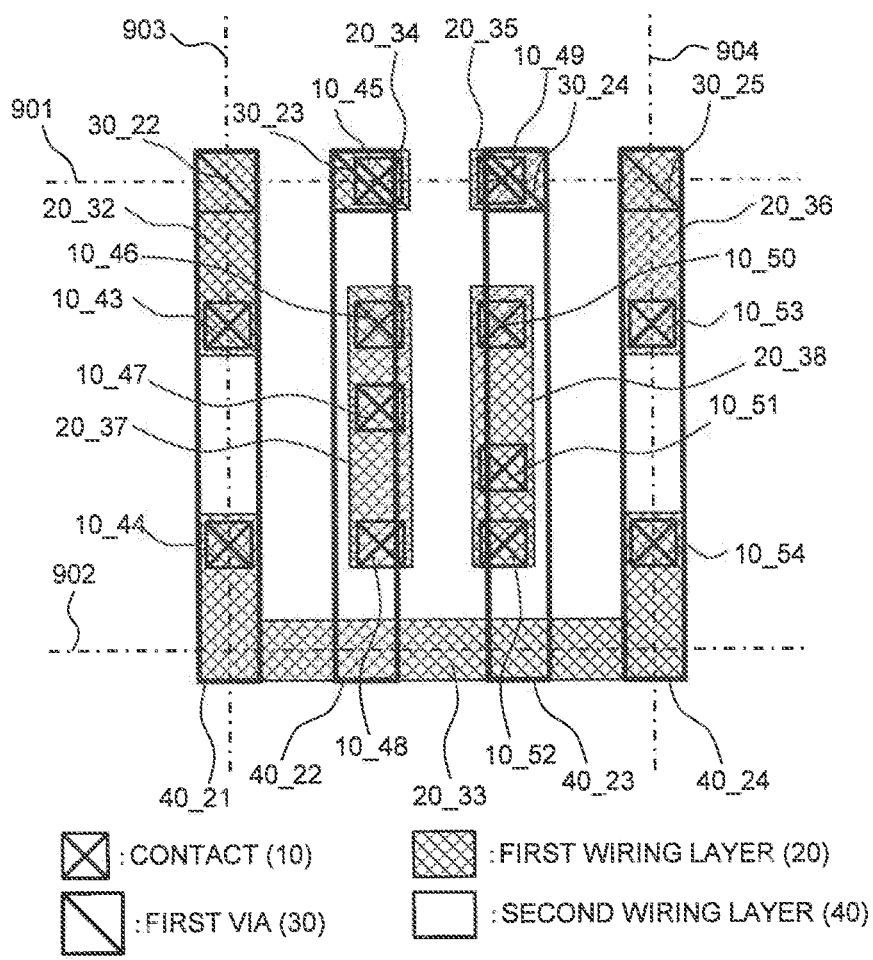
FIG. 29 is a layout illustration of the vertical type memory cell (the contact layer, first wiring layer, first via, and second wiring layer) of SRAM according to the seventh embodiment of the invention.

FIGS. 28 and 29 are layout illustrations of a vertical type memory cell of SRAM according to the seventh embodiment of the invention. The memory cell is also a 6-transistor CMOS-SRAM memory cell, and the equivalent circuit thereof is as shown in FIG. 33. In FIG. 28, the diffusion layers 217 to 220, the gate wiring lines 314 to 316, and contacts 10_43 and 10_54 are shown. In FIG. 29, the contacts 10_43 to 10_54, the first wiring lines 20_32 to 20_38 formed by the first wiring layer 20, and the first vias 30_22 to 30_25, and the second wiring lines 40_21 to 40_24 formed by the second wiring layer 40. In FIGS. 28 and 29, the reference numerals 901 to 904 each represent a cell boundary. As shown in FIG. 14, the memory cells are arranged in a matrix form with the cell boundaries coincident with each other, in which adjacent memory cells are arranged so that the layout pattern of one memory cell mirror-inverted about the cell boundary therebetween coincides with the layout pattern of the other memory cell.

The memory cell of SRAM according to the seventh embodiment of the invention is a vertical type memory cell having: a word line formed by the gate wiring line 314, and a source line formed by the first wiring line 20_33, each arranged in the row direction; and ground lines formed by the second wiring lines 40_21 and 40_24, and a pair of bit lines which are complementary to each other and formed by the second wiring lines 40_22 and 40_23, each arranged in the column direction. The word and source lines may be led up to the third wiring layer outside the cell to connect to the third wiring lines each provided along the row direction.

In the cell of FIG. 28, two n-channel MOSFETs are formed by the diffusion layers 217 and 219, and the gate wiring line 314 as a pair of access transistors. The pair of access transistors correspond to the n-channel MOSFETs 91 and 92 of the equivalent circuit shown in FIG. 33. A pair of inverters are constituted by: n-channel MOSFETs (corresponding to the transistors 93 and 94 of FIG. 33) formed by a combination of the diffusion layer 217 and the gate wiring line 315, and a combination of the diffusion layer 219 and the gate wiring line 316, respectively; and p-channel MOSFETs (corresponding to the transistors 95 and 96 of FIG. 33) formed by a combination of the diffusion layer 218 and the gate wiring line 315, and a combination of the diffusion layer 220 and the gate wiring line 316, respectively. The memory cell is formed by connecting the input/output terminal of one inverter to the output/input terminal of the other. The gate wiring line 314 of the pair of access transistors is used as a word line and directly connected to that of the adjacent memory cell, making a wiring line which runs across a memory mat in the row direction. The drain and source terminals which are not connected to the pair of inverters are connected to a pair of bit lines complementary to each other. The reference numerals 10_45 and 10_49 represent contacts for connecting to the pair of bit lines complementary to each other; 10_43 and 10_53 represent contacts for connecting the pair of inverters to the ground lines; and 10_44 and 10_54 represent contacts for connecting the pair of inverters to the source line.

In FIG. 29, the contacts 10_43 to 10_54, the first wiring lines 20_32 to 20_38 formed by the first wiring layer 20, the first via 30_22-30_25, and the second wiring lines 40_21 to 40_24 formed by second wiring layer 40 are shown. The contacts 10_46, 10_47, 10_48, 10_50, 10_51 and 10_52, and the first wiring lines 20_37 and 20_38 form wiring lines for connecting the output of each inverter to the input of the other inverter. The first wiring lines 20_34 and 20_35 connected to the contacts 10_45 and 10_49 are each composed of an island-like pattern formed by the first wiring layer 20 for connecting to the bit lines which are complementary to each other and formed by the overlying second wiring lines 40_22 and 40_23. The second wiring lines 40_21 to 40_24 are a pair of bit lines complementary to each other and ground lines, which extend from the upper end cell boundary 901 to the lower end cell boundary 902 in the column direction, and which are connected with the corresponding wiring lines of an adjacent memory cell in the column direction. The second wiring lines 40_21 and 40_24 are connected through the first vias 30_22 and 30_25 to the first wiring lines 20_32 and 20_36 respectively. The second wiring line 40_22 is connected through the first via 30_23 to the island-like pattern of the first wiring line 20_34 formed by the first wiring layer 20. The second wiring line 40_23 is connected through the first via 30_24 to the island-like pattern of the first wiring line 20_35 formed by the first wiring layer 20.

The first wiring lines 20_34 and 20_35 are each composed of a small island-like pattern having a width as large as the minimum line width, and a length of about 1.1 times the minimum line width. In the line 20_34, the contact 10_45 and the first via 30_23 are arranged; in the line 20_35, the contact 10_49 and the first via 30_24 are arranged. The first via 30_23 has three sides in touch with the first wiring line 20_34, and the misalignment can occur with the three sides. Likewise, the first via 30_24 has three sides in touch with the first wiring line 20_35, and the misalignment can occur with the three sides. If the misalignment occurs, the disappearance of the lower titanium film of the first wiring line progresses from the side involved in the misalignment, which can cause the rise in the resistance of connection with a contact adjacent thereto or disconnection. This is the same problem as the inventor found in regard to the first to three embodiments. Hence, the contact 10_45 and the first via 30_23 should be disposed as far away from each other as possible, and also the contact 10_49 and the first via 30_24 should be disposed as far away from each other as possible. Thus, the influence of disappearance of the lower titanium film of the first wiring line can be minimized, and the reduction in the yield can be suppressed.

The first vias 30_22 and 30_25 for connecting the ground lines to the second wiring lines 40_21 and 40_24 are disposed, in the first wiring lines 20_32 and 20_36, at intersecting points between the cell boundary 901 and the first wiring lines. In this way, the distances of the first vias 30_22 and 30_25 to the contacts 10_43 and 10_53 can be made larger. Therefore, the reduction in the yield, which results from the rise in the resistance of the contacts 10_43 and 10_53 or disconnection owing to the disappearance of the lower titanium layer in the first wiring lines 20_32 and 20_36, can be suppressed. Further, the same first via may be laid out in the symmetric position in an adjacent memory cell above the cell boundary 901 in the drawing as in the fifth embodiment described with reference to FIG. 24. In this case, the parasitic resistance component produced by the first via can be suppressed.

[Eighth Embodiment]

Figure 30:
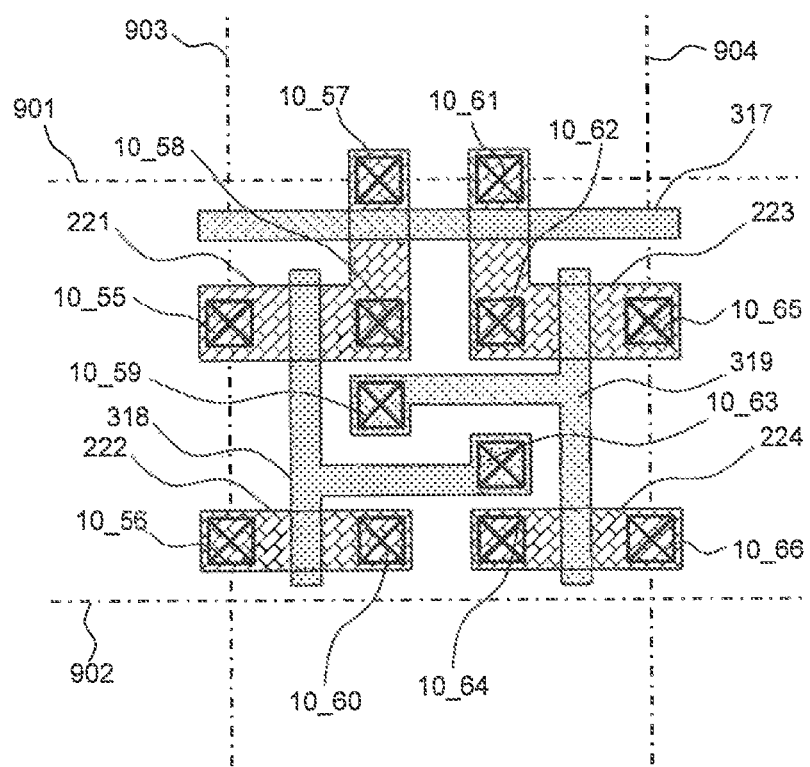
FIG. 30 is a layout illustration of a vertical type memory cell (the diffusion layer, gate wiring layer, and contact layer) of SRAM according to the eighth embodiment of the invention.
Figure 31:
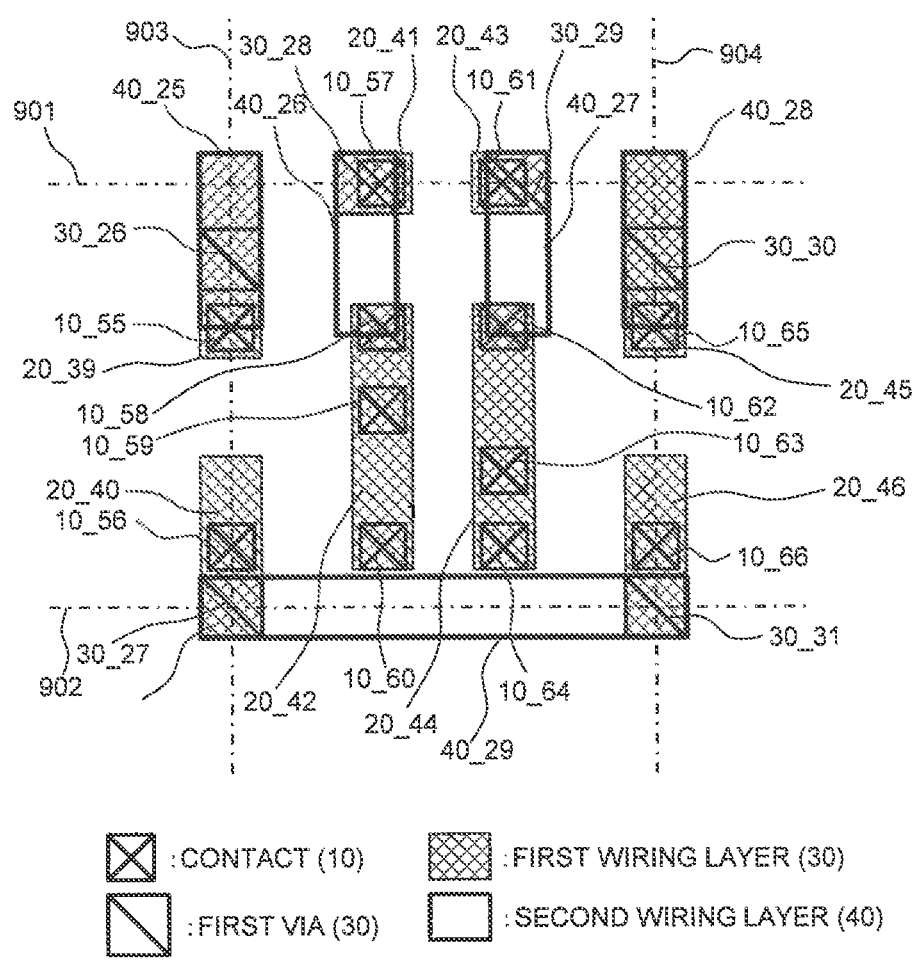
FIG. 31 is a layout illustration of the vertical type memory cell (the contact layer, the first wiring layer, the first via, and the second wiring layer) of SRAM according to the eighth embodiment of the invention.
Figure 32:
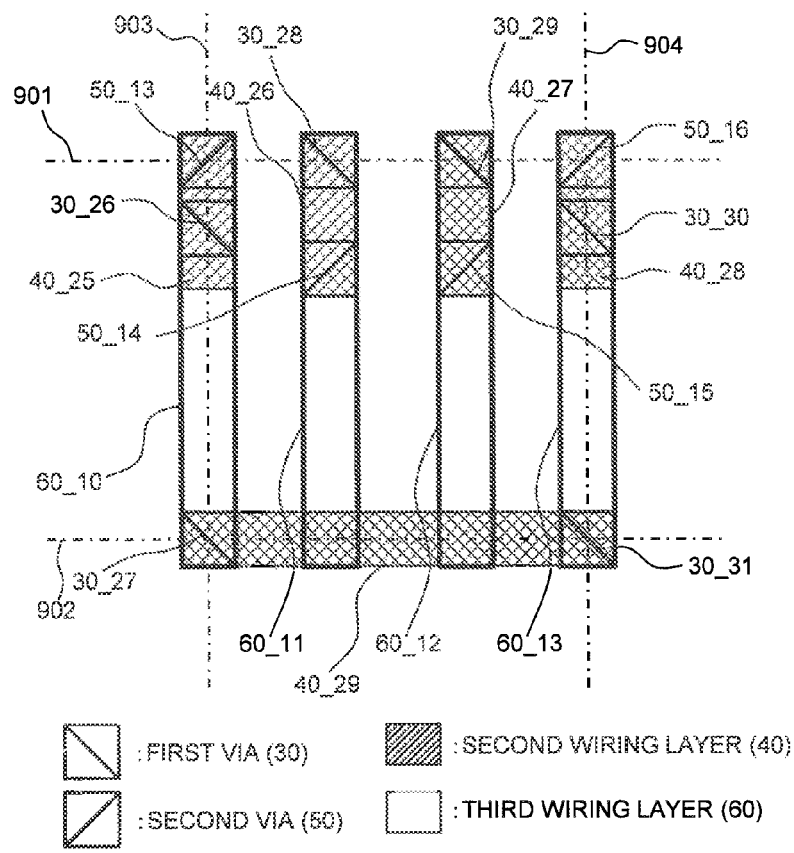
FIG. 32 is a layout illustration of the vertical type memory cell (the first via, the second wiring layer, the second via, and the third wiring layer) of SRAM according to the eighth embodiment of the invention.

FIGS. 30 to 32 are layout illustrations of a vertical type memory cell of SRAM according to the eighth embodiment of the invention. The memory cell is also a 6-transistor CMOS-SRAM memory cell, and the equivalent circuit thereof is as shown in FIG. 33. In FIG. 30, the diffusion layers 221 to 224, the gate wiring lines 317 to 319, and the contacts 10_55 to 10_66 are shown. In FIG. 31, the contacts 10_55 to 10_66, the first wiring lines 20_39 to 20_46 formed by the first wiring layer 20, the first vias 30_26 to 30_31, and the second wiring lines 40_25 to 40_29 formed by second wiring layer 40 are shown. In FIG. 32, the first vias 30_26 to 30_31, the second wiring lines 40_25 to 40_29, the second vias 50_14 to 50_16 and the third wiring lines 60_10 to 60_13 formed by the third wiring layer 60 are shown. In FIGS. 30 to 32, the reference numerals 901 to 904 each represent a cell boundary. As shown in FIG. 14, the memory cells are arranged in a matrix form with the cell boundaries coincident with each other, in which adjacent memory cells are arranged so that the layout pattern of one memory cell mirror-inverted about the cell boundary therebetween coincides with the layout pattern of the other memory cell.

The memory cell of SRAM according to the eighth embodiment of the invention is a vertical type memory cell having: a word line formed by the gate wiring line 317, a source line formed by the second wiring line 40_29, each arranged in the row direction; and a pair of bit lines complementary to each other, which are formed by the third wiring lines 60_11 and 60_12, and ground lines formed by the third wiring lines 60_10 and 60_13, each arranged in the column direction.

In the memory cell of FIG. 30, two n-channel MOSFETs are formed by the diffusion layers 221 and 223, and the gate wiring line 317 as a pair of access transistors. The pair of access transistors correspond to the n-channel MOSFETs 91 and 92 of the equivalent circuit shown in FIG. 33. A pair of inverters are constituted by: n-channel MOSFETs (corresponding to the transistors 93 and 94 of FIG. 33) formed by a combination of the diffusion layer 221 and the gate wiring line 318, and a combination of the diffusion layer 223 and the gate wiring line 319, respectively; and p-channel MOSFETs (corresponding to the transistors 95 and 96 of FIG. 33) formed by a combination of the diffusion layer 222 and the gate wiring line 318, and a combination of the diffusion layer 224 and the gate wiring line 319, respectively. The memory cell is formed by connecting the input/output terminal of one inverter to the output/input terminal of the other. The gate wiring line 317 of the pair of access transistors is used as a word line and directly connected to that of the adjacent memory cell, making a wiring line which runs across a memory mat in the row direction. The drain and source terminals which are not connected to the pair of inverters are connected to a pair of bit lines complementary to each other. The reference numerals 10_57 and 10_61 represent contacts for connecting to the pair of bit lines complementary to each other; 10_55 and 10_65 represent contacts for connecting the pair of inverters to the ground lines; and 10_56 and 10_66 represent contacts for connecting the pair of inverters to the source line.

In FIG. 31, the contacts 10_55 to 10_66, the first wiring lines 20_39 to 20_46, the first vias 30_26 to 30_31, and the second wiring lines 40_25 to 40_29 are shown. The contacts 10_58 to 10_60, 10_62 to 10_64, and the first wiring lines 20_42 and 20_44 form wiring lines for connecting the output of each inverter to the input of the other inverter. The contacts 10_57 and 10_61, the first wiring lines 20_41 and 20_43, the first vias 30_28 and 30_29, and the second wiring lines 40_26 and 40_27 form wiring lines for connecting to the overlying layer, i.e. the pair of bit lines which are complementary to each other and formed by the third wiring lines 60_11 and 60_12.

The first wiring lines 20_41 and 20_43 are each composed of an island-like pattern formed by the first wiring layer 20. The second wiring lines 40_26 and 40_27 are each composed of an island-like pattern formed by the second wiring layer 40. The contacts 10_55 and 10_65, the first wiring lines 20_39 and 20_45, the first via 30_26 and 30_30, the second wiring lines 40_25 and 40_28 form wiring lines for connecting to the overlying layer, i.e. the ground lines formed by the third wiring lines 60_10 and 60_13. The first wiring lines 20_39 and 20_45 are each composed of an island-like pattern formed by the first wiring layer 20. The second wiring lines 40_25 and 40_28 are each composed of an island-like pattern formed by the second wiring layer 40. The second wiring line 40_29 is a source line which extends from the left-hand cell boundary 903 to the right-hand cell boundary 904 in the row direction, and which is connected to the source line of an adjacent memory cell in the row direction. The second wiring line 40_29 is connected through the first vias 30_27 and 30_31 to the first wiring lines 20_40 and 20_46. The first wiring lines 20_40 and 20_46 are each composed of an island-like pattern formed by the first wiring layer 20.

In FIG. 32, the first vias 30_26 to 30_31, the second wiring lines 40_25 to 40_29, the second vias 50_14 to 50_16 and the third wiring lines 60_10 to 60_13 are shown. The third wiring lines 60_10 to 60_13 are a pair of bit lines complementary to each other and ground lines, which extend from the upper end cell boundary 901 to the lower end cell boundary 902 in the column direction, and which are connected with the corresponding wiring lines of an adjacent memory cell in the column direction. The third wiring lines 60_11 and 60_12 are connected through the second vias 50_14 and 50_15 to the second wiring lines 40_26 and 40_27, respectively. The third wiring lines 60_10 and 60_13 are connected through the second vias 50_13 and 50_16 to the second wiring lines 40_25 and 40_28. The second wiring lines 40_25, 40_26, 40_27 and 40_28 are each composed of an island-like pattern formed by the second wiring layer 40.

The first wiring lines 20_41 and 20_43 are each composed of a small island-like pattern having a width as large as the minimum line width, and a length of about 1.1 times the minimum line width. In the line 20_41, the contact 10_57 and the first via 30_28 are arranged; in the line 20_43, the contact 10_61 and the first via 30_29 are arranged. The first via 30_28 has three sides in touch with the first wiring line 20_41, and the misalignment can occur with the three sides. Likewise, the first via 30_29 has three sides in touch with the first wiring line 20_43, and the misalignment can occur with the three sides. If the misalignment occurs, the disappearance of the lower titanium film of the first wiring line progresses from the side involved in the misalignment, which can cause the rise in the resistance of connection with a contact adjacent thereto or disconnection. This is the same problem as the inventor found in regard to the first to three embodiments. Hence, the contact 10_57 and the first via 30_28 should be disposed as far away from each other as possible, and also the contact 10_61 and the first via 30_29 should be disposed as far away from each other as possible. Thus, the influence of disappearance of the lower titanium film of the first wiring line can be minimized, and the reduction in the yield can be suppressed.

The second wiring lines 40_26 and 40_27 are each composed of an island-like pattern having a width as large as the minimum line width, and a length of about double the minimum line width. In the line 40_26, the first via 30_28 and the second via 50_14 are arranged; in the line 40_27, the first via 30_29 and the second via 50_15 are arranged. The second via 50_14 has two sides in touch with the second wiring line 40_26, and the misalignment can occur with the two sides. Likewise, the second via 50_15 has two sides in touch with the second wiring line 40_27, and the misalignment can occur with the two sides. If the misalignment occurs, the disappearance of the lower titanium film of the second wiring line progresses from the side involved in the misalignment, which can cause the rise in the resistance of connection with a contact adjacent thereto or disconnection. This is the same problem as the inventor found in regard to the first to three embodiments as described above concerning the relation between the contacts and the first vias. Hence, the first via 30_28 and the second via 50_14 should be disposed as far away from each other as possible, and also the first via 30_29 and the second via 50_15 should be disposed as far away from each other as possible. Thus, the influence of disappearance of the lower titanium film of the second wiring line can be minimized, and the reduction in the yield can be suppressed. Further, in comparison to a layout according to the prior art such that second vias comparable to the second vias 50_14 and 50_15 are arranged on the cell boundary 901, the resistances associated with the second vias 50_14 and 50_15 can be held down. Incidentally, in a layout such that the second vias 50_14 and 50_15 are arranged on the cell boundary 901, the second vias 50_14 and 50_15 coincide in position with the corresponding second vias 50_14 and 50_15 of an adjacent memory cell on the upper side of the cell boundary 901 in the drawing and as such, one second via for each bit line is shared by two memory cells arrayed to be adjacent to each other in the up and down direction in the drawing. In contrast, according to the present invention, the second vias are arranged away from the cell boundary 901 as described in this embodiment, and the second vias 50_14 and 50_15 are disposed in each of two memory cells adjacent to each other in the up and down direction. Consequently, two second vias are provided for each bit line. Since the two second vias are connected in parallel, to each other, the resistance component thereof becomes one half in combination. Even if one of the two vias is disconnected or increased in resistance, SRAM works properly as long as the resistance of the other via is sufficiently small and as such, the effect of further suppressing the reduction in the yield is also brought about.

In regard to parts connected to the third wiring line 60_10 serving as a ground line, the first and second wiring lines 20_39 and 40_25 are each composed of an island-like pattern having a width as large as the minimum line width and a length of two to three times the minimum line width, and the second via 50_13 is disposed on one end of the second wiring line 40_25. The second wiring line 40_25 has a width as large as the minimum line width, and one side of the second via 50_13 has the same size, and three sides of the second via 50_13 overlap the end of the second wiring line 40_25. Therefore, if there is an alignment deviation of the second via 50_13 on the second wiring line 40_25 in the horizontal direction in the drawing, the problem of the misalignment is caused. Even if the actual minimum processing size of the second wiring layer or the second via is different from the minimum line width and as such, the side of the second via is somewhat away from the end of the second wiring line, the misalignment as described above can be caused according to the statistical variation as long as the gap between the side of the second via and the end of the second wiring line is smaller than the alignment accuracy. As a result of the misalignment, the lower titanium film of the second wiring line 40_25 can start disappearing from where the misalignment occurs. To reduce the influence of the disappearance of the lower titanium film, the first via 30_26 is disposed away from the position right below the second via 50_13 downward in the drawing. The misalignment can be caused on the left or right side of the second via. In such a case, the disappearance of the lower titanium film can start from the left or right side where the misalignment occurs, and spread. On this account, it is desired to dispose the first via as far away from the second via as possible. The relation between the first via 30_26 and the first wiring line 20_39 can be likewise considered, and the misalignment of the first via 30_26 can cause the disappearance of the lower titanium film of the first wiring line 20_39. While the first via 30_26 is disposed to be in touch with neither of the upper and lower ends of the first wiring line 20_39, the displacement to the left or right can cause the misalignment. The contact 10_55 is disposed on the lower end of the first wiring line 20_39. Therefore, to minimize the influence of the disappearance of the lower titanium film of the first wiring line 20_39 owing to the misalignment, it is desired to dispose the first via 30_26 as far away from the position of the contact 10_55 as possible. Hence, it is the most preferable to arrange the first via 30_26 between the contact 10_55 and the second via 50_13 and if possible, in a position equally apart from the contact 10_55 and the second via 50_13.

Exactly the same applies to the parts connected to the third wiring line 60_13 serving as a ground line. It is the most preferable to arrange the first via 30_30 between the contact 10_65 and the second via 50_16 and if possible, in a position equally apart from the contact 10_65 and the second via 50_16.

[Modification of the Eighth Embodiment]

In regard to the cell of FIGS. 31 and 32, of the parts connected with the third wiring line 60_10 used as a ground line, the first via 30_26 may be disposed on the cell boundary 901, and the second via 50_13 may be arranged on the lower end of the second wiring line 40_25. In case that the misalignment of the second via 50_13 on the lower end of the second wiring line 40_25, the disappearance of the lower titanium film of the second wiring line 40_25 starts from the side, of three sides of the lower end of second wiring line 40_25, where the misalignment occurs. Arranging the first via 30_26 on the cell boundary 901 as described above, the first via 30_26 can be laid out in the farthest position from the three sides of the lower end of the second wiring line 40_25 from which the disappearance of the lower titanium film would start and spread and therefore, the influence of the disappearance of the lower titanium film can be minimized. Likewise, as to the parts connected to the third wiring line 60_13 serving as the other ground line, the first via 30_30 may be arranged on the cell boundary 901, and the second via 50_16 may be arranged on the lower end of the second wiring line 40_28; exactly the same effect as the parts connected to the third wiring line 60_10 can be brought about.

Within one cell, the contact 10_55 is laid out near the second via 50_13, and the contact 10_65 is laid out near the second via 50_16. However, even if the misalignment of the second via 50_13 or 50_16 occurs, the electrical connections between the contacts 10_55 and 10_65, and corresponding first wiring lines 20_39 and 20_45 are not affected, and the misalignment does not pose any problem.

In addition, the same problem is solved by arranging the first via between the second via and the contact of an adjacent cell instead of arranging the first via between the second via and the contact within one cell.

Further, this modification brings about a large effect of suppressing the reduction in the yield, even if the island-like first wiring lines 20_39 and 20_45, and the island-like second wiring lines 40_25 and 40_28 are short in length. The reason for this is as follows. In a condition such that the island-like first wiring lines (20_39 and 20_45) of adjacent cells are connected with each other, and the island-like second wiring lines (40_25 and 40_28) are connected with each other, it is sufficient to arrange the first vias 30_26 and 30_30 between the second vias and the adjacent cell contacts (10_55 and 10_65) and therefore, the layout of the cell can performed so that the distance between the first via and the second via, and the distance between the first via and the contact are larger than those in the eighth embodiment.

While the invention made by the inventor has been concretely described above based on the embodiments, the invention is not limited to the embodiments. It is obvious that various modifications and changes may be made without departing from the subject matter thereof.

For instance, the invention can be likewise applied to, in addition to SRAM, a semiconductor integrated circuit device for which a layout design such that the misalignment is permitted without keeping any alignment margin for the purpose of increasing the scale of integration is adopted.

What is claimed is:

1. An SRAM comprising a plurality of memory cells arranged in a matrix form, each memory cell including:
   (a) a substrate with MOSFET formed therein;
   (b) a contact for forming an electrical connection with the MOSFETs;
   (c) a first wiring line which is electrically connected with the contact, and formed by a first wiring layer having a metal layer of titanium or tantalum in a plane in touch with the contact, and which has a width as large as a minimum line width in the first wiring layer;
   (d) a first via which has a tungsten plug and is electrically connected with the first wiring line;
   (e) a second wiring line which is electrically connected with the first via, and formed by a second wiring layer having a metal layer of titanium or tantalum in a plane in touch with the first via, and which has a width as large as a minimum line width in the second wiring layer; and
   (f) a second via which is electrically connected with the second wiring line, and which has a tungsten plug and has one side as large as the minimum line width in the second wiring layer,
   wherein the second wiring line extends in the same direction as that of the first wiring line extending in a row or column direction, and has a length of two to three times the minimum line width in the second wiring layer, and
   in a plane in parallel with the substrate, the first via is disposed in a position between the contact and the second via, said contact, first via, and second via being displaced with respect to each other in a length direction of the second wiring line so that the distance between the first via and the contact is shorter than the distance between the contact and the second via, and the distance between the first and second vias is shorter than the distance between the contact and the second via.

2. The SRAM according to claim 1, wherein the first via is disposed, in a plane in parallel with the substrate, in a position where the distance between the first and second vias is equal to the distance between the first via and the contact.

3. The SRAM according to claim 1, wherein a direction in which the first wiring line extends is defined as a row direction,
   each memory cell further includes:
   (g) a third wiring line which is electrically connected with the second via, and formed by a third wiring layer, and which extends in a column direction orthogonal to the row direction at a cell boundary of the memory cell,
   wherein the third wiring line is a ground line in the memory cell,
   one memory cell which is mirror-inverted about the cell boundary in the row direction in a plane in parallel with the substrate coincides in layout with another memory cell adjacent to the one memory cell,
   the second via which is mirror-inverted about the cell boundary in the row direction coincides with the second via of the adjacent memory cell, and
   in one of the memory cells adjacent to each other, the layout of the first via is left out.

4. The SRAM according to claim 2, wherein a direction in which the first wiring line extends is defined as a row direction,
   each memory cell further includes:
   (g) a third wiring line which is electrically connected with the second via, and formed by a third wiring layer, and which extends in a column direction orthogonal to the row direction at a cell boundary of the memory cell,
   wherein the third wiring line is a ground line in the memory cell,
   one memory cell which is mirror-inverted about the cell boundary in the row direction in a plane in parallel with the substrate coincides in layout with another memory cell adjacent to the one memory cell,
   the second via which is mirror-inverted about the cell boundary in the row direction coincides with the second via of the adjacent memory cell, and
   in one of the memory cells adjacent to each other, the layout of the first via is left out.

5. The SRAM according to claim 1, wherein a direction in which the first wiring line extends is defined as a row direction,
   each memory cell further includes:
   (g) a third wiring line which is electrically connected with the second via, and formed by a third wiring layer, and which extends in a column direction orthogonal to the row direction at a cell boundary of the memory cell,
   wherein the third wiring line is a ground line in the memory cell,
   one memory cell which is mirror-inverted about the cell boundary in the row direction coincides in layout with another memory cell adjacent to the one memory cell,
   the second via which is mirror-inverted about the cell boundary in the row direction coincides with the second via of the adjacent memory cell, and
   the first vias are joined to each other in the adjacent memory cells adjacent to each other.

6. The SRAM according to claim 2, wherein a direction in which the first wiring line extends is defined as a row direction,
   each memory cell further includes:
   (g) a third wiring line which is electrically connected with the second via, and formed by a third wiring layer, and which extends in a column direction orthogonal to the row direction at a cell boundary of the memory cell,
   wherein the third wiring line is a ground line in the memory cell,
   one memory cell which is mirror-inverted about the cell boundary in the row direction coincides in layout with another memory cell adjacent to the one memory cell,
   the second via which is mirror-inverted about the cell boundary in the row direction coincides with the second via of the adjacent memory cell, and
   the first vias are joined to each other in the adjacent memory cells adjacent to each other.

7. The SRAM according to claim 1, wherein a direction in which the first wiring line extends is defined as a row direction,
   each memory cell further includes:

(g) a third wiring line which is electrically connected with the second via, and formed by a third wiring layer, and which extends in a column direction orthogonal to the row direction, wherein the third wiring line is a bit line in the memory cell.

8. The SRAM according to claim 2, wherein, a direction in which the first wiring line extends is defined as a row direction, each memory cell further includes:

(g) a third wiring line which is electrically connected with the second via, and formed by a third wiring layer, and which extends in a column direction orthogonal to the row direction, wherein the third wiring line is a bit line in the memory cell.

9. An SRAM comprising a plurality of memory cells arranged in a matrix form, each memory cell including:

(a) a substrate with MOSFET formed therein;

(b) a contact for forming an electrical connection with the MOSFETs;

(c) a first wiring line which is electrically connected with the contact, and formed by a first wiring layer having a metal layer of titanium or tantalum in a plane in touch with the contact, and which has a width as large as a minimum line width in the first wiring layer, and a length of larger than the minimum line width and up to double the minimum line width; and (d) a first via which has a tungsten plug and is electrically connected with the first wiring line, wherein in a plane in parallel with the substrate, the first via is disposed to be adjacent to one end of a larger side of the first wiring line with a margin smaller than an alignment accuracy between the first via and the first wiring line, and the contact is disposed on the other end of the longer side of the first wiring line.

10. The SRAM according to claim 9, wherein each memory cell further includes:

(e) a second wiring line which is electrically connected with the first via, and formed by a second wiring layer, and which extends in a column direction orthogonal to a row direction, wherein the second wiring line is a bit line in the memory cell.

11. An SRAM comprising a plurality of memory cells arranged in a matrix form, each memory cell including:

(a) a substrate with MOSFET formed therein;

(d) a first via having a tungsten plug;

(e) a second wiring line which is electrically connected with the first via, and formed by a second wiring layer having a metal layer of titanium or tantalum in a plane in touch with the first via, and which has a width as large as a minimum line width in the second wiring layer, and a length of larger than the minimum line width and up to double the minimum line width;

(f) a second via which is electrically connected with the second wiring line, and which has a tungsten plug and has one side as large as the minimum line width in the second wiring layer, wherein in a plane in parallel with the substrate, the second via is disposed to be adjacent to one end of a longer side of the second wiring line with a margin smaller than an alignment accuracy between the second via and the second wiring line, and the first via is disposed on the other end of the longer side of the second wiring line.

12. The SRAM according to claim 11, wherein each memory cell further includes:

(g) a third wiring line which is electrically connected with the second via, and formed by a third wiring layer, wherein the third wiring line is a bit line in the memory cell.

13. An SRAM comprising a plurality of memory cells arranged in a matrix form, each memory cell including:

(a) a substrate with MOSFET formed therein;

(b) a contact for forming an electrical connection with the MOSFETs;

(c) a first wiring line which is electrically connected with the contact, and formed by a first wiring layer having a metal layer of titanium or tantalum in a plane in touch with the contact, and which has a width as large as a minimum line width in the first wiring layer;

(d) a first via which has a tungsten plug and is electrically connected with the first wiring line;

(e) a second wiring line which is electrically connected with the first via, and formed by a second wiring layer having a metal layer of titanium or tantalum in a plane in touch with the first via, and which has a width as large as a minimum line width in the second wiring layer; and (f) a second via which is electrically connected with the second wiring line, and which has a tungsten plug and has one side as large as the minimum line width in the second wiring layer, wherein the second wiring line extends in the same direction as that of the first wiring line extending in a row or column direction, is connected with a corresponding second wiring line in an adjacent memory cell, has a length of 4 to 8 times the minimum line width in the second wiring layer, and in a plane in parallel with the substrate, the first via is disposed in a position between the contact and an adjacent second via in the adjacent memory cell, which corresponds to the second via, said contact, first via, and second via being displaced with respect to each other in a length direction of the second wiring line so that the distance between the first via and the contact is shorter than the distance between the contact and the adjacent second via, and the distance between the first via and the adjacent second, via is shorter than the distance between the contact and the adjacent second via.

14. The SRAM according to claim 13, wherein the first via is disposed in a position where the distance between the adjacent second via and the first via is equal to the distance between the first via and the contact in a plane in parallel with the substrate.

* * * * *